(12) United States Patent
Wilson et al.

(10) Patent No.: US 10,278,287 B2
(45) Date of Patent: Apr. 30, 2019

(54) SMART PACKAGE AND MONITORING SYSTEM WITH INDICATOR AND METHOD OF MAKING SAME

(71) Applicant: Intelligent Devices Sezc Inc., Grand Cayman (KY)

(72) Inventors: Allan Wilson, Ottawa (CA); Michael Petersen, Ottawa (CA); Dean Brotzel, Ottawa (CA)

(73) Assignee: Intelligent Devices Sezc Inc., Grand Cayman (KY)

( * ) Notice: Subject to any disclaimer, the term of this patent is extended or adjusted under 35 U.S.C. 154(b) by 732 days.

(21) Appl. No.: 13/870,721

(22) Filed: Apr. 25, 2013

(65) Prior Publication Data
US 2013/0285681 A1   Oct. 31, 2013

(30) Foreign Application Priority Data
Apr. 25, 2012 (CA) ...................... 2775546

(51) Int. Cl.
*A61J 1/03* (2006.01)
*A61J 7/04* (2006.01)
(Continued)

(52) U.S. Cl.
CPC .............. *H05K 1/118* (2013.01); *A61J 1/035* (2013.01); *A61J 7/0409* (2013.01);
(Continued)

(58) Field of Classification Search
CPC ........ A61J 1/035; A61J 7/0481; A61J 7/0418; A61J 7/0436; A61J 2200/30; A61J 7/0076
See application file for complete search history.

(56) References Cited

U.S. PATENT DOCUMENTS 3,967,161 A * 6/1976 Lichtblau ............. G06K 19/067
 257/E27.114
4,480,760 A * 11/1984 Schonberger ........ B65D 55/066
 215/230
(Continued)

FOREIGN PATENT DOCUMENTS

CA   2353350        7/2001
CA   2719054 A1    4/2012
(Continued)

OTHER PUBLICATIONS

Supplemental Partial European Search Report for EP13780596, dated Jan. 28, 2016; 4 pages.
(Continued)

*Primary Examiner* — Benyam Haile
*Assistant Examiner* — Muhammad Adnan
(74) *Attorney, Agent, or Firm* — Fitch, Even, Tabin & Flannery LLP

(57) ABSTRACT

There is provided a smart package and monitoring system having a status indicator and a method of making the same. The smart package includes an electronic sensor monitoring tag having re-usable electronic circuitry and power source along with a conductive grid printed on a thin flexible substrate and connected to the tag so the tag and grid are in electrical continuity to form a monitoring device. The conductive grid is aligned with an opening of the smart package. The smart package can also include an optical ink indicator configured to display the status of the package. A multiplexer can be used to connect the tag to the conductive grid. The conductive grid can include capacitive sensors formed on a thin plastic layer and positioned so as to form a capacitive element with the conductive side of the blister.

26 Claims, 32 Drawing Sheets

US 10,278,287 B2
Page 2

(51) Int. Cl.
*H05K 1/02* (2006.01)
*H05K 1/11* (2006.01)
*H05K 3/12* (2006.01)
*H05K 1/16* (2006.01)

(52) U.S. Cl.
CPC .......... *H05K 3/1275* (2013.01); *A61J 7/0436* (2015.05); *A61J 2205/20* (2013.01); *H05K 1/0269* (2013.01); *H05K 1/0287* (2013.01); *H05K 1/16* (2013.01); *H05K 2203/1545* (2013.01); *Y10T 29/49155* (2015.01)

(56) References Cited

U.S. PATENT DOCUMENTS

| | | | |
|---|---|---|---|
| 4,890,763 A * | 1/1990 | Curiel | B65D 25/34 206/459.1 |
| 5,412,372 A * | 5/1995 | Parkhurst | A61J 7/0481 340/568.1 |
| 5,474,194 A * | 12/1995 | Heilman | B65D 55/066 215/230 |
| 5,499,597 A * | 3/1996 | Kronberg | B23K 37/006 116/216 |
| 5,544,770 A * | 8/1996 | Travisano | B65D 55/026 206/807 |
| 6,010,771 A * | 1/2000 | Isen | G01V 15/00 101/153 |
| 6,181,287 B1 * | 1/2001 | Beigel | G06K 19/07749 343/741 |
| 6,244,462 B1 * | 6/2001 | Ehrensvard | A61J 1/035 221/25 |
| 6,344,190 B1 * | 2/2002 | Nair | A61K 31/045 424/725 |
| 6,411,567 B1 * | 6/2002 | Niemiec | A61J 7/0481 368/10 |
| 6,616,035 B2 * | 9/2003 | Ehrensvard | G06Q 20/10 235/379 |
| 6,628,199 B1 | 9/2003 | Ehrensvard et al. | |
| 6,753,830 B2 * | 6/2004 | Gelbman | G06F 3/147 340/5.91 |
| 7,113,101 B2 | 9/2006 | Petersen et al. | |
| 7,170,409 B2 * | 1/2007 | Ehrensvard | G06K 19/07798 340/539.13 |
| 7,178,417 B2 | 2/2007 | Petersen et al. | |
| 7,546,675 B2 * | 6/2009 | Forster | G06K 19/07718 29/593 |
| 7,616,116 B2 * | 11/2009 | Ehrensvard | G08B 13/1445 340/541 |
| 7,623,040 B1 | 11/2009 | Cote | G08B 13/2414 206/471 |
| 7,712,674 B1 * | 5/2010 | Warner | G06K 19/07749 235/487 |
| 7,772,974 B2 * | 8/2010 | Ehrensvard | B65D 5/4233 340/541 |
| 8,067,697 B2 * | 11/2011 | Lee | H05K 1/028 174/253 |
| 8,212,677 B2 * | 7/2012 | Ferguson | G06F 19/3462 340/10.1 |
| 8,465,425 B2 * | 6/2013 | Heller | A61B 5/14532 600/345 |
| 9,128,192 B2 * | 9/2015 | Christophersen | H01J 3/14 |
| 2001/0020935 A1 * | 9/2001 | Gelbman | G06F 3/147 345/173 |
| 2002/0067270 A1 * | 6/2002 | Yarin | A61J 7/0481 340/573.1 |
| 2004/0144976 A1 * | 7/2004 | Dahmani | H01L 51/5262 257/40 |
| 2005/0007296 A1 * | 1/2005 | Endo | G06K 19/0726 343/895 |
| 2005/0011163 A1 * | 1/2005 | Ehrensvard | G08B 13/126 53/410 |
| 2005/0024290 A1 * | 2/2005 | Aisenbrey | G06K 19/07749 343/873 |
| 2005/0054317 A1 * | 3/2005 | Ro | H01Q 5/42 455/269 |
| 2005/0122219 A1 * | 6/2005 | Petersen | A61J 1/035 340/568.1 |
| 2005/0218233 A1 * | 10/2005 | Petersen | G06K 19/0717 235/492 |
| 2005/0223826 A1 * | 10/2005 | Petersen | A61J 7/0481 73/865.9 |
| 2005/0225445 A1 * | 10/2005 | Petersen | B65D 5/42 340/568.2 |
| 2006/0020189 A1 * | 1/2006 | Brister | A61B 5/0002 600/345 |
| 2006/0109123 A1 * | 5/2006 | Carrender | G06K 19/0723 340/572.1 |
| 2006/0144747 A1 * | 7/2006 | Le | A61J 7/0481 206/531 |
| 2006/0179652 A1 * | 8/2006 | Petersen | H05K 3/361 29/825 |
| 2006/0184493 A1 * | 8/2006 | Shiffman | G06F 19/327 706/47 |
| 2006/0273912 A1 * | 12/2006 | Komatsu | C23C 28/04 340/572.8 |
| 2007/0008121 A1 * | 1/2007 | Hart | G06K 19/0739 340/540 |
| 2007/0259716 A1 * | 11/2007 | Mattice | G06F 3/013 463/36 |
| 2007/0278285 A1 * | 12/2007 | Ehrensvaerd | G06Q 10/08 235/375 |
| 2008/0004176 A1 * | 1/2008 | Cullen | B41M 5/20 503/200 |
| 2008/0046268 A1 * | 2/2008 | Brown | G06Q 10/067 705/2 |
| 2008/0053040 A1 * | 3/2008 | Petersen | H05K 1/0266 53/396 |
| 2008/0053222 A1 * | 3/2008 | Ehrensvard | G01D 11/24 73/431 |
| 2008/0061986 A1 * | 3/2008 | Ficker | G06K 19/07771 340/572.8 |
| 2008/0191174 A1 * | 8/2008 | Ehrensvard | C09J 9/02 252/500 |
| 2008/0198098 A1 * | 8/2008 | Gelbman | G06F 3/147 345/59 |
| 2008/0259416 A1 * | 10/2008 | Peters | G02B 5/18 359/2 |
| 2008/0262883 A1 * | 10/2008 | Weiss | G06Q 10/00 705/7.42 |
| 2008/0303637 A1 * | 12/2008 | Gelbman | G06K 7/10079 340/10.42 |
| 2009/0001988 A1 * | 1/2009 | Allison | A61J 1/035 324/348 |
| 2009/0071270 A1 * | 3/2009 | Petersen | G06K 19/04 73/866.5 |
| 2009/0194452 A1 * | 8/2009 | Hession | A61J 1/035 206/531 |
| 2009/0289202 A1 * | 11/2009 | Yakimov | H01L 51/5259 250/473.1 |
| 2009/0302120 A1 * | 12/2009 | Omura | G03H 1/02 235/492 |
| 2009/0314529 A1 * | 12/2009 | Petersen | C09D 11/30 174/257 |
| 2010/0000899 A1 * | 1/2010 | Burg | B65D 83/0463 206/459.1 |
| 2010/0089789 A1 * | 4/2010 | Rosenbaum | A61J 1/035 206/531 |
| 2010/0089791 A1 * | 4/2010 | Rosenbaum | A61J 1/035 206/531 |
| 2010/0170352 A1 * | 7/2010 | Petersen | G01D 9/005 73/865.8 |
| 2010/0242629 A1 * | 9/2010 | Leuenberger | A61J 1/035 73/862.625 |
| 2011/0003411 A1 * | 1/2011 | Choi | H01L 33/44 438/27 |
| 2011/0175735 A1 * | 7/2011 | Forster | A61B 5/4833 340/573.1 |
| 2011/0241721 A1 * | 10/2011 | Schroeter | G01R 31/2808 324/763.01 |

(56) References Cited

U.S. PATENT DOCUMENTS

| | | | | |
|---|---|---|---|---|
| 2011/0296925 A1* | 12/2011 | Miesel | ................. | G01L 9/0072 |
| | | | | 73/718 |
| 2012/0009872 A1* | 1/2012 | Lane | ..................... | G01K 1/024 |
| | | | | 455/41.1 |
| 2012/0098642 A1* | 4/2012 | Krawczewicz | .. | G06K 19/07707 |
| | | | | 340/10.1 |
| 2012/0104097 A1* | 5/2012 | Moran | ................. | G06K 7/0004 |
| | | | | 235/449 |
| 2012/0136469 A1* | 5/2012 | Petersen | ................. | H01Q 1/22 |
| | | | | 700/110 |
| 2013/0004750 A1* | 1/2013 | Majumdar | ......... | H01L 51/0022 |
| | | | | 428/202 |
| 2013/0032934 A1* | 2/2013 | Fisch | ................. | H01L 23/5384 |
| | | | | 257/698 |
| 2013/0087469 A1* | 4/2013 | Khasnis | ............... | A61J 7/0418 |
| | | | | 206/38 |
| 2014/0152323 A1* | 6/2014 | Kumar | ................... | G01F 23/00 |
| | | | | 324/658 |
| 2015/0347713 A1* | 12/2015 | Seeger | ................. | A61J 7/0418 |
| | | | | 700/236 |

FOREIGN PATENT DOCUMENTS

| | | | |
|---|---|---|---|
| CN | 103249653 A | 8/2013 | |
| DE | 3028808 A1 | 3/1982 | |
| JP | 2003518410 A | 6/2003 | |
| JP | 2006519737 A | 8/2006 | |
| JP | 2010075227 A | 4/2010 | |
| WO | 0147466 A1 | 7/2001 | |
| WO | 2009135283 | 11/2009 | |

OTHER PUBLICATIONS

English translation of Notification of Reason for Refusal (Request for the Submission of an Opinion), KR 20147032793 dated Apr. 19, 2016; translation obtained from Global Dossier; 10 pages.
Notification of Reasons for Refusal, JP 2015507310 dated Apr. 26, 2016; translation obtained from Global Dossier; 2 pages.
CN Office Action for CN201380021400.4 dated Dec. 23, 2015; 15 pages.
Chinese Patent Application No. 201380021400.4; The Second Office Action dated Aug. 5, 2016.
European Patent Application No. 13 780 596.6; European Search Opinion Dated Jun. 24, 2016.
Korean Patent Application No. 10-2014-7032793; Final Office Action; Notification of Reason for Refusal dated Oct. 28, 2016.
Japanese Patent Application No. 2015-507310; Notification of Reasons for Refusal Dated Nov. 15, 2016.

\* cited by examiner

Fig. 9
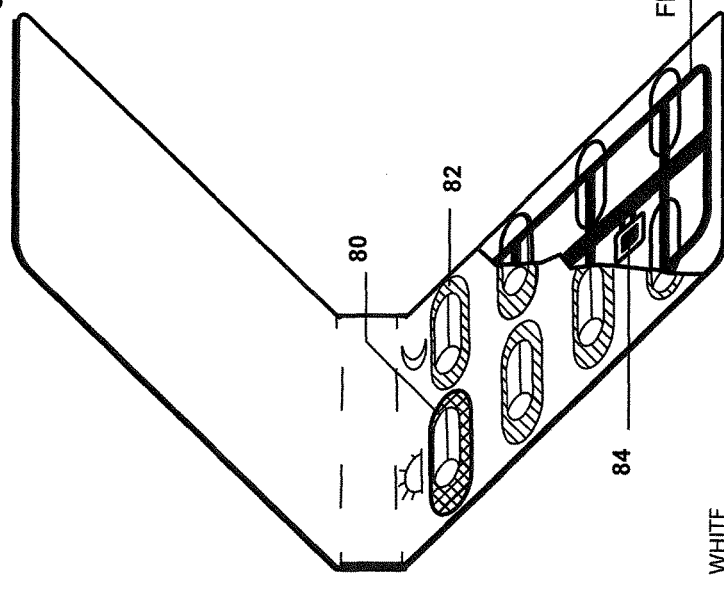
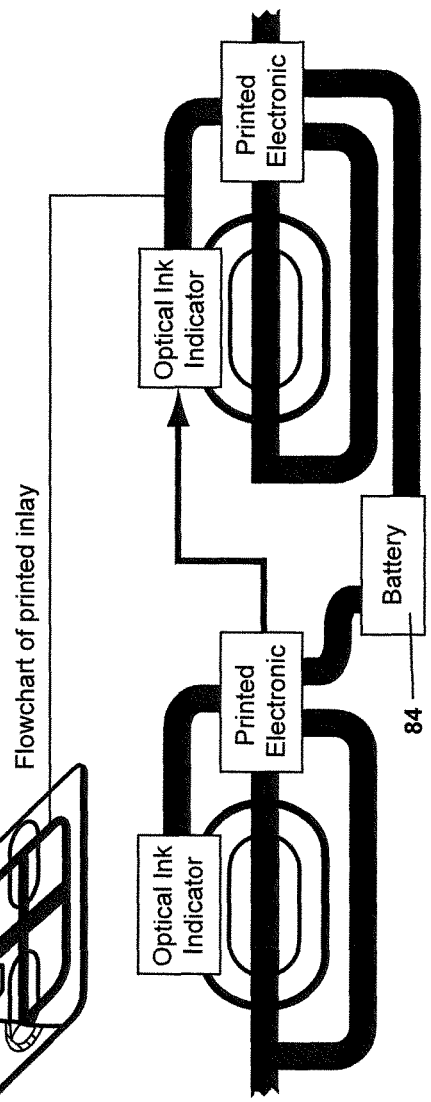

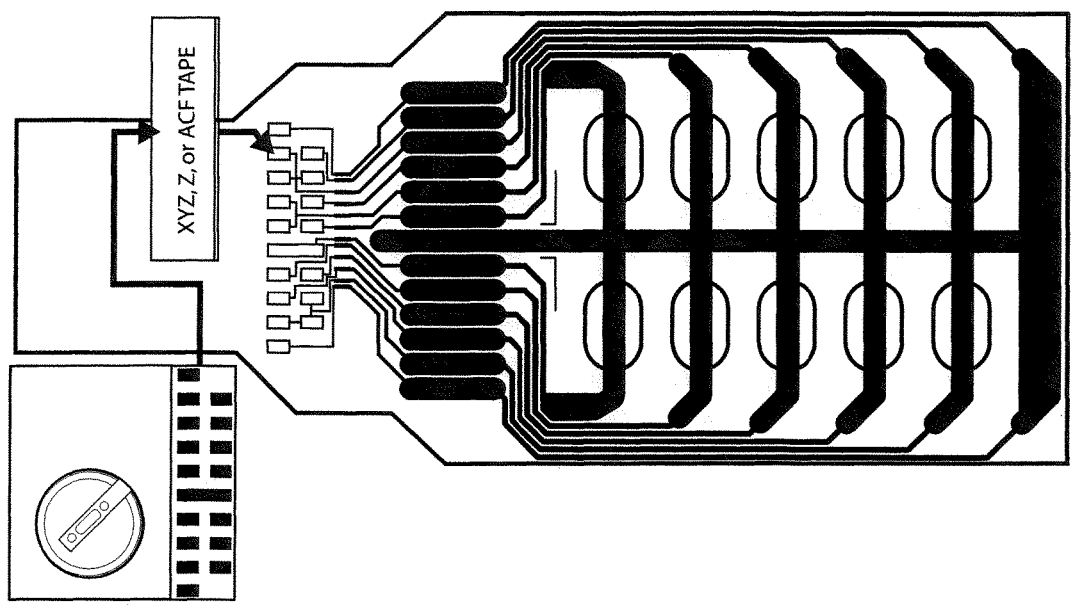
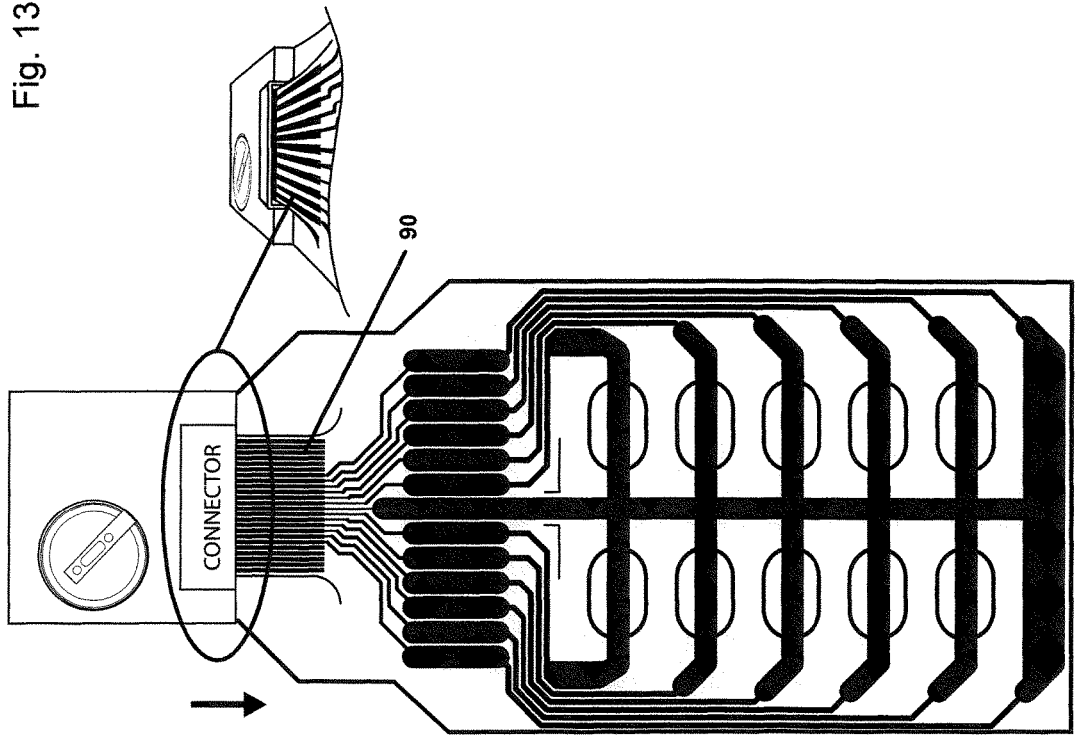
Fig. 13

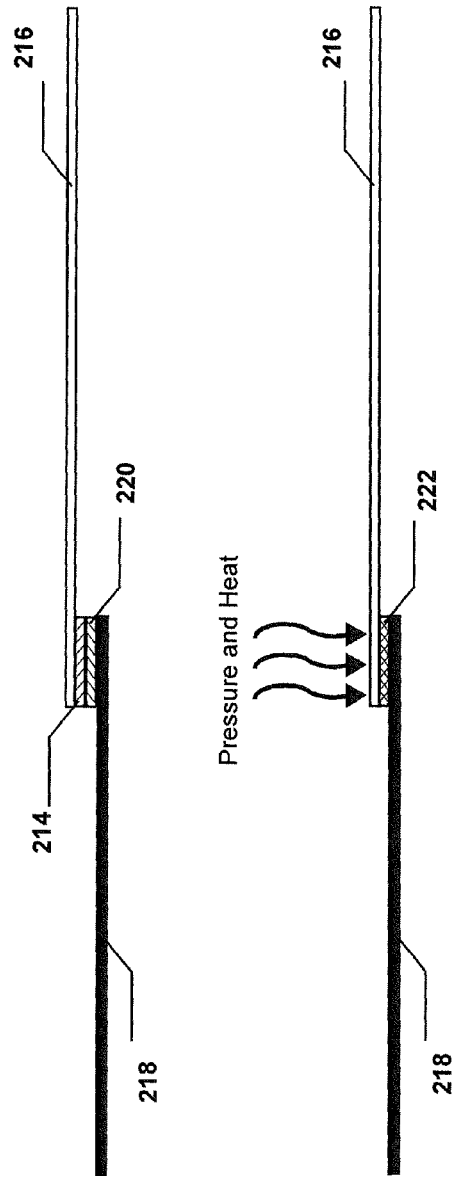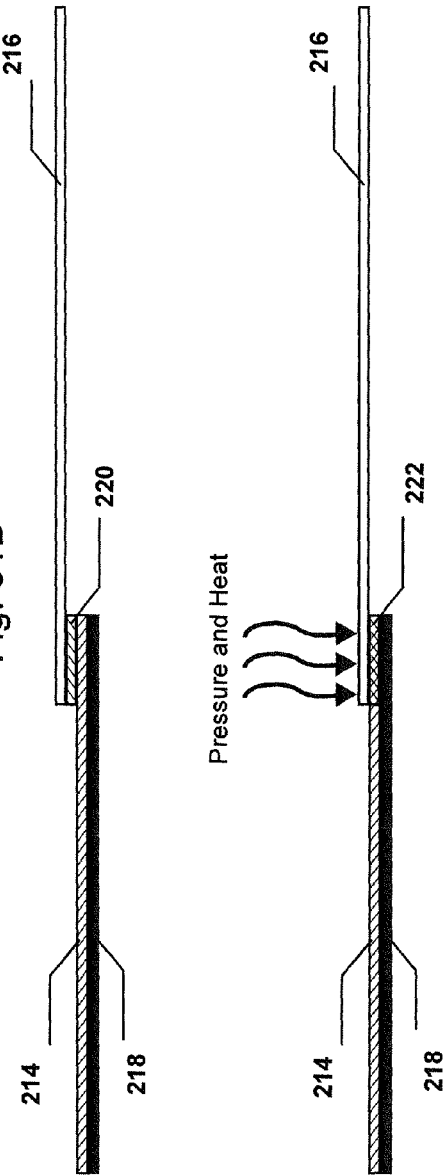

SMART PACKAGE AND MONITORING SYSTEM WITH INDICATOR AND METHOD OF MAKING SAME

RELATED APPLICATION(S)

This application claims priority to Canadian application No. 2,775,546 files Apr. 25, 2012, which is hereby incorporated herein by reference.

TECHNICAL FIELD

The present invention relates to a content use monitoring package with a status indicator and a method of making the same.

BACKGROUND

Allan Wilson, Michael Petersen, Ehrensvaerd Jakob and Grip Stina, amongst others, have described devices for monitoring, recording and downloading medication dispensing histories for blister packaged medication; see for example U.S. Pat. Nos. 7,113,101, 7,178,417, 6,628,199, 6,244,462, 7,170,409, 6,616,035, 7,616,116 and 7,772,974 along with PCT application having publication number WO/2009/135283. Also see Canadian application No. 2353350 and U.S. Publication Nos. 20070278285, 20080191174 and 20080053222.

Such devices broadly comprise sensor detecting/monitoring electronic tags, sensor grids printed with conductive ink, means of connecting the two and means of inserting the device in a pharmaceutical blister package.

Despite having been marketed and tested for ten years, the success of any current technology for medication monitoring of blister packages has been severely limited. A need has been identified for further refinements of such devices to address problems with the current technologies. These include:
- difficulty connecting the flexible substrate grid physically and electrically to the rigid tag
- instability of conductive inks printed on paperboard substrates yielding unreliable electrical characteristics
- tendency of printed conductive inks to crack under repeated deformation (bending)
- cost of conductive inks
- difficulty tearing or breaking the substrate with normal tablet expulsion
- cost of the sensor monitoring tag The pharmaceutical market wants a medication monitoring device that is:
- cheap
- 100 percent reliable
- fits seamlessly into the packaging process
- is easy for the consumer to use
- has a reusable electronic module
- allows for the use of breakable substrates to facilitate consumer use
- allows for the use of thin substrates to minimize package bulk
- can accommodate optional functionality including reminders, data input buttons, and LED and LCD displays, etc.
- can accommodate optional printed devices including humidity and temperature sensors, printed wireless communication including capacitive coupled, RFID, HF, UHF, Bluetooth and NFC, and OLED displays, printed batteries etc Furthermore, the Clinical Trials sector in Pharmaceutical Business requires
- very fast turn-around
- minimal tooling cost and delays
- small volume runs which can be produced reliably and to pharmaceutical standards
- seamless integration into clinical trials packaging process and using standard pharmaceutical child resistant packaging solutions such as DosePak (by Meadwestvaco), Eco-SlideRX (by Keystone Packaging), SHR (by Stora Enso) and any other type of blister card solution existing now or in the future.

SUMMARY

In accordance with one aspect of the present invention, there is provided a smart package monitoring system comprising an electronic sensor monitoring tag having re-usable electronic circuitry and power source; a conductive grid printed on a thin flexible substrate and connected to the tag so the tag and grid are in electrical continuity to form a monitoring device; and an optical ink indicator configured to display the status of the package.

In accordance with another aspect of the present invention, there is provided the smart package monitoring system wherein the conductive grid is aligned with an opening of the smart package.

In accordance with a further aspect of the present invention, there is provided the smart package monitoring system wherein the conductive grid is aligned with an opening of the smart package.

In accordance with yet a further aspect of the present invention, there is provided the smart package monitoring system wherein the conductive grid is aligned with an opening of the smart package.

In accordance with a still further aspect of the present invention, there is provided the smart package monitoring system wherein the optical ink indicator is associated with the conductive grid.

In accordance with yet another aspect of the present invention, there is provided the smart package monitoring system wherein the optical ink indicator is formed from bistatic inks.

In accordance with another aspect of the present invention, there is provided the smart package monitoring system wherein the optical ink indicator is formed from printed OLED or an LED module.

In accordance with a further aspect of the present invention, there is provided the smart package monitoring system wherein the status is indicated with a change in color.

In accordance with yet a further aspect of the present invention, there is provided the smart package monitoring system wherein the status indicates the package being unopened, the package being opened within an appropriate time window, the package being opened within an inappropriate time window, and/or expiration of content by means of time, temperature, humidity sensor, exposure to UV radiation or non-compliancy.

In accordance with a still further aspect of the present invention, there is provided a smart package monitoring system comprising an electronic sensor monitoring tag having re-usable electronic circuitry and power source; a conductive grid printed on a thin flexible substrate; and a multiplexer connecting the tag to the conductive grid so the tag and grid are in electrical continuity to form a monitoring device.

In accordance with yet another aspect of the present invention, there is provided the smart package monitoring system wherein the conductive grid is aligned with an opening of the smart package.

In accordance with another aspect of the present invention, there is provided the smart package monitoring system wherein the multiplexer is formed of printed transistors.

In accordance with a further aspect of the present invention, there is provided the smart package monitoring system wherein the multiplexer is printed with the conductive grid.

In accordance with yet a further aspect of the present invention, there is provided the smart package monitoring system wherein the multiplexer connects the grid to the tag with at least two leads.

In accordance with a still further aspect of the present invention, there is provided a smart package comprising the smart package monitoring system and a card having product receptacles.

In accordance with yet another aspect of the present invention, there is provided the smart package wherein the product receptacles are blisters.

In accordance with another aspect of the present invention, there is provided a smart package comprising a card having product receptacles and a conductive side; an electronic sensor monitoring tag having re-usable electronic circuitry and power source; and a conductive grid printed on a thin flexible substrate and connected to the tag so the tag and grid are in electrical continuity to form a monitoring device; wherein the conductive grid includes capacitive sensors formed with the conductive side of the card as one of the plates of the capacitive sensors; and wherein the conductive grid is aligned with the product receptacles in the card.

In accordance with a further aspect of the present invention, there is provided the smart package wherein each of the capacitive sensors has the other plate formed on a thin plastic layer and positioned so as to form a capacitive element with the conductive side of the card.

In accordance with yet a further aspect of the present invention, there is provided the smart package wherein each capacitive element is of variable size.

In accordance with a still further aspect of the present invention, there is provided the smart package further comprising a conductive trace grid associated with the capacitive sensors in the conductive grid.

In accordance with yet another aspect of the present invention, there is provided the smart package wherein the grid is connected using conductive patches applied or printed onto heat sealable cardboard.

In accordance with another aspect of the present invention, there is provided the smart package wherein the grid is connected using conductive stitching.

In accordance with a further aspect of the present invention, there is provided the smart package wherein the grid is connected using a continuous surface of Z-directional conductive adhesive tape.

In accordance with yet a further aspect of the present invention, there is provided the smart package wherein the grid is connected using selectively applied XYZ-directional conductive adhesive tape.

In accordance with a still further aspect of the present invention, there is provided the smart package wherein the grid is connected using a continuous surface of anisotropic conductive film.

In accordance with yet another aspect of the present invention, there is provided the smart package wherein the grid is formed with thermal transfer ribbon digital printing technology.

In accordance with another aspect of the present invention, there is provided the smart package wherein the grid is formed with vacuum deposition.

In accordance with a further aspect of the present invention, there is provided the smart package wherein the product receptacles are blisters.

In accordance with yet a further aspect of the present invention, there is provided a method of forming a conductive grid having a substrate for a smart package comprising the steps of releasing conductive material from a continuous roll of conductively coated transfer ribbon onto a surface of the substrate and thereby subtractively forming sensor grids and connection patches to be joined with an electronic tag of the smart package.

In accordance with a still further aspect of the present invention, there is provided the method further comprising the step of applying a heat activated adhesive to one side of the grid.

In accordance with yet another aspect of the present invention, there is provided the smart package for use in monitoring patient compliance during clinical drug trials.

In accordance with another aspect of the present invention, there is provided the smart package wherein the tag has data communication means for transmitting data.

In accordance with a further aspect of the present invention, there is provided the smart package wherein the data is used for measuring time-dependent covariates to reduce error variance and increase statistical power of the drug trial.

In accordance with yet a further aspect of the present invention, there is provided the smart package wherein the data establishes patient compliance profiles.

In accordance with a still further aspect of the present invention, there is provided the smart package wherein the patient compliance profiles incorporate a time dimension using multivariate regression techniques to create dynamic compliance profiles for individual patients or groups of patients.

In accordance with yet another aspect of the present invention, there is provided the smart package wherein the data is from various sources and is pooled to form a common resource for further data mining.

In accordance with another aspect of the present invention, there is provided the smart package wherein the pooled data are stored remotely on a cloud server.

In accordance with a further aspect of the present invention, there is provided the smart package used as a secure compliance monitoring blister package for the dispensing of medication.

In accordance with yet a further aspect of the present invention, there is provided the smart package wherein the blister package incorporates a unique ID number to facilitate tracking.

In accordance with a still further aspect of the present invention, there is provided the smart package wherein the ID number is used to authenticate the content and detect tampering with the package.

In accordance with yet another aspect of the present invention, there is provided the smart package wherein the package is equipped with reminder devices for the user.

In accordance with another aspect of the present invention, there is provided the smart package wherein the reminders are auditory, visual or tactile using sounds, LEDs, LCDs, OLEDs or vibration.

In accordance with a further aspect of the present invention, there is provided the smart package monitoring system wherein the tag validates suitability of the content based on pre-set thresholds.

In accordance with yet a further aspect of the present invention, there is provided the smart package wherein the optical ink indicator changes color to indicate that the content shall not be consumed when the tag determines the content is unsuitable based on the pre-set thresholds.

BRIEF DESCRIPTION OF THE DRAWINGS

The invention will be further understood from the following description with reference to the attached drawings.

FIG. 9 shows a content use monitoring package and the printed circuitry.

FIG. 13 shows a grid cable inserted into the connector.

FIG. 31A shows tag/grid connection using conductive ink/heat activated adhesive with the ink under the adhesive.

FIG. 31B shows tag/grid connection using conductive ink/heat activated adhesive with the ink above the adhesive.

DETAILED DESCRIPTION

The invention uses technology discussed in Canadian Application No. 2,719,054 which is incorporated herein by reference.

Initially FIGS. 1 to 8 will be discussed in order to describe an example of a content use monitoring package and method of manufacturing thereof. This particular example is shown within the context of monitoring the consumption of blister-packaged medication doses; however it will be appreciated that other shapes, sizes and types of packages containing other types of contents could also be monitored.

Figure 1:
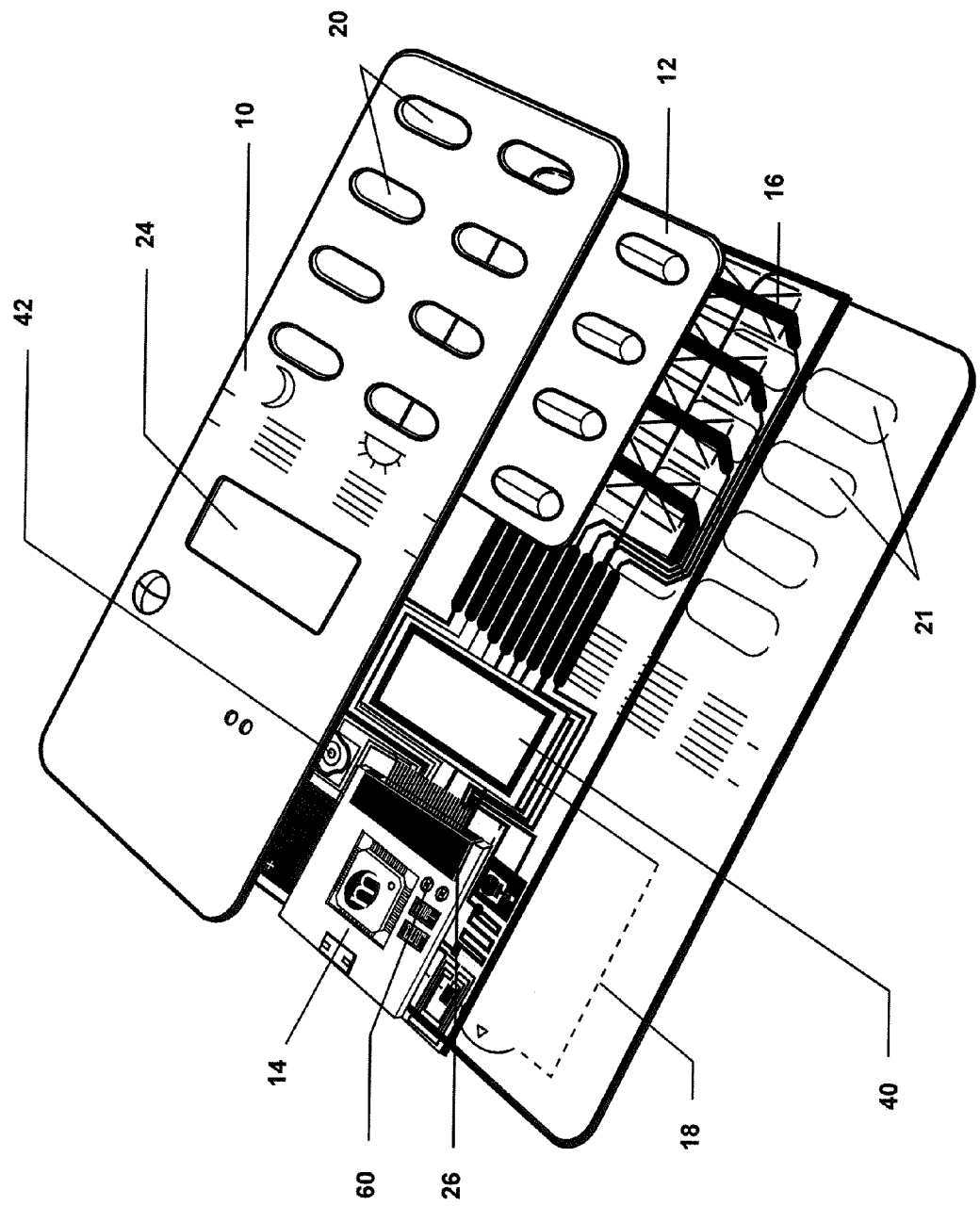
FIG. 1 shows the content use monitoring package in a disassembled state, showing each layer therein.
Figure 2:
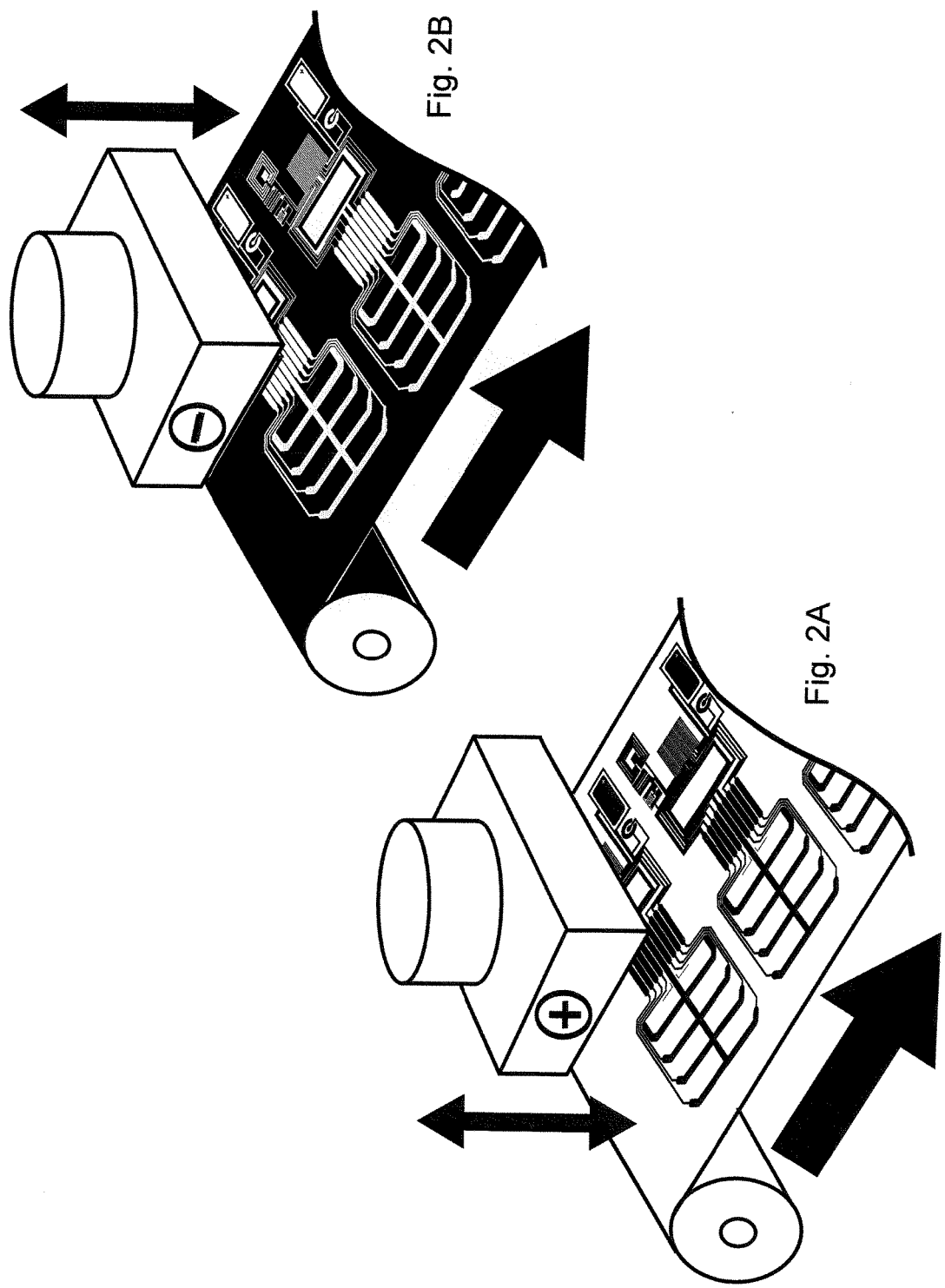
FIG. 2A shows printing of the conductive grid with an additive printing process, or application using vacuum metal vapour deposition technology.
FIG. 2B shows printing of the conductive grid with a subtractive printing process.

FIG. 1 shows the various layers of an example of a content use monitoring package. The cover 10 or top layer is preferably made of Easy Seal® paperboard or similar material commonly used in the food and pharmaceutical packaging industry. This is followed by a medication blister card 12 underneath with each blister aligned with a cutout 20 in the cover 10. The third layer comprises a reusable electronic sensor monitoring tag 14 connected to a conductive grid 16 printed on thin Mylar, plastic or similar substrate by a flat flex connector 26 which connection is reversible by unplugging. The grid 16 is rupturable and is aligned with the associated blisters and may or may not contain a self-adhesive layer with removable liner. The fourth and bottom layer is a backing made of Easy Seal® or other paperboard die cut to form a pull-out tab 18 to tear open the used package and allow the tag 14 to be removed from the package by unplugging the connector 26. The tag 14 can then be reused in conjunction with a new printed grid and its battery replaced as required. The backing has cutouts 21 associated with the cut-outs 20 in the cover 10. The conductive grid can be optionally adhered to the blister card with any form of suitable self-adhesive means.

FIG. 2A shows one manner of printing the conductive grid by an additive printing process using conductive inks containing zinc, silver, aluminium, carbon or other conductive material. This can be accomplished using standard flexographic, screenprint, inkjet, offset, or other printing methods. Also shown in FIG. 2B is the subtractive printing process in which the dielectric Mylar or similar substrate has been coated with a conductive substance that is subsequently removed by die-cutting or chemical etching to leave behind the conductive traces of the grid. It is also possible to produce a subtractive process by die cutting thin flexible foils and applying them onto a dielectric surface.

Figure 3:
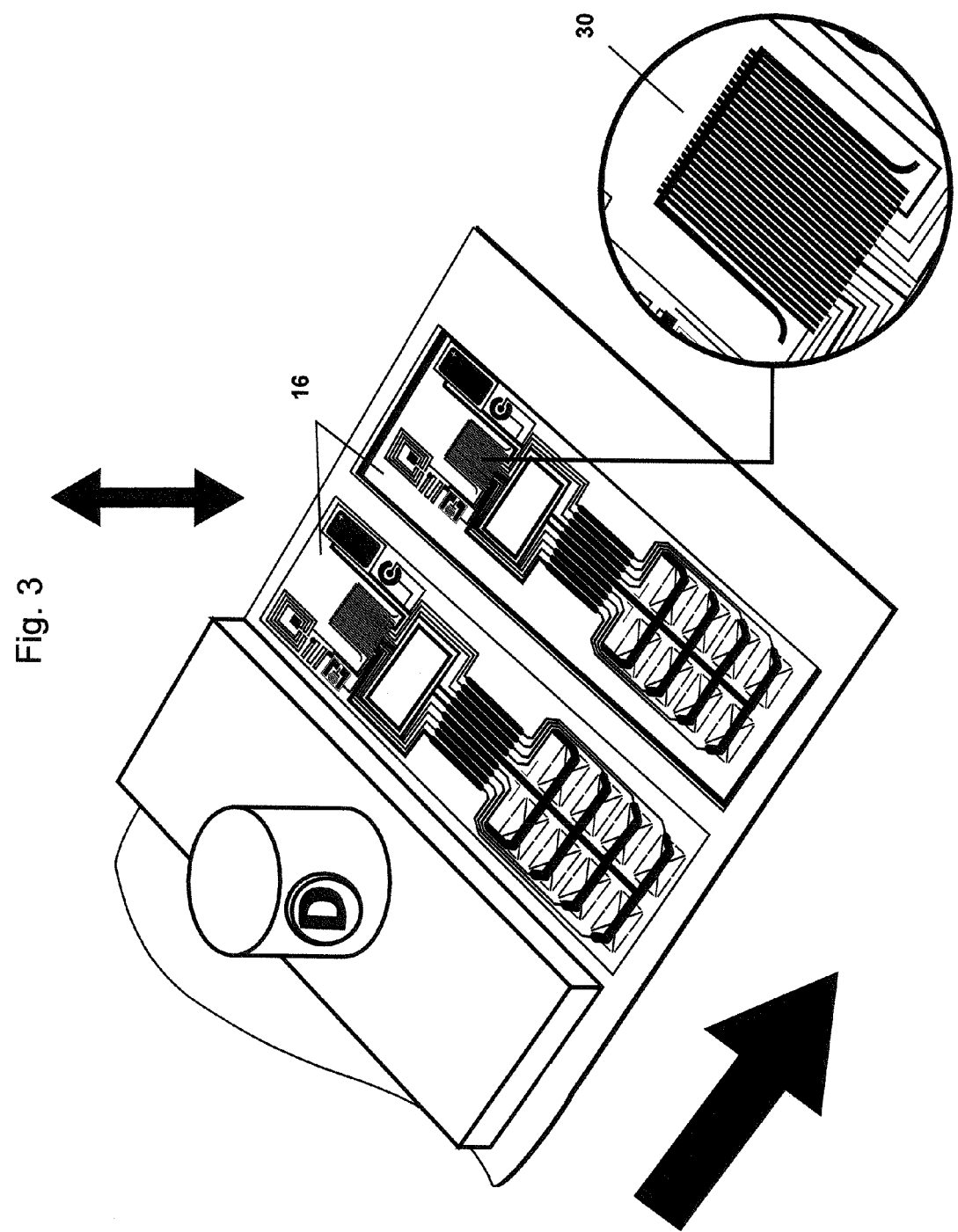
FIG. 3 depicts die-cutting the printed grid to create the interface with one part of the flat flex connector.

FIG. 3 shows how the grid contacts for a flat flex connector can be die-cut from the printed grid for precise alignment with the contacts of the connector. Precise alignment is important if numerous conductive traces are to be connected to the tag as in digital grid designs having many individual circuits. The flat cable wires 30 for the flat flex connector are die-cut from the grid inlay as shown in the expanded view. The grid inlay is also die-cut to create flat connector wires along with the blister opening pattern and to ensure a fit with the paperboard.

Figure 4:
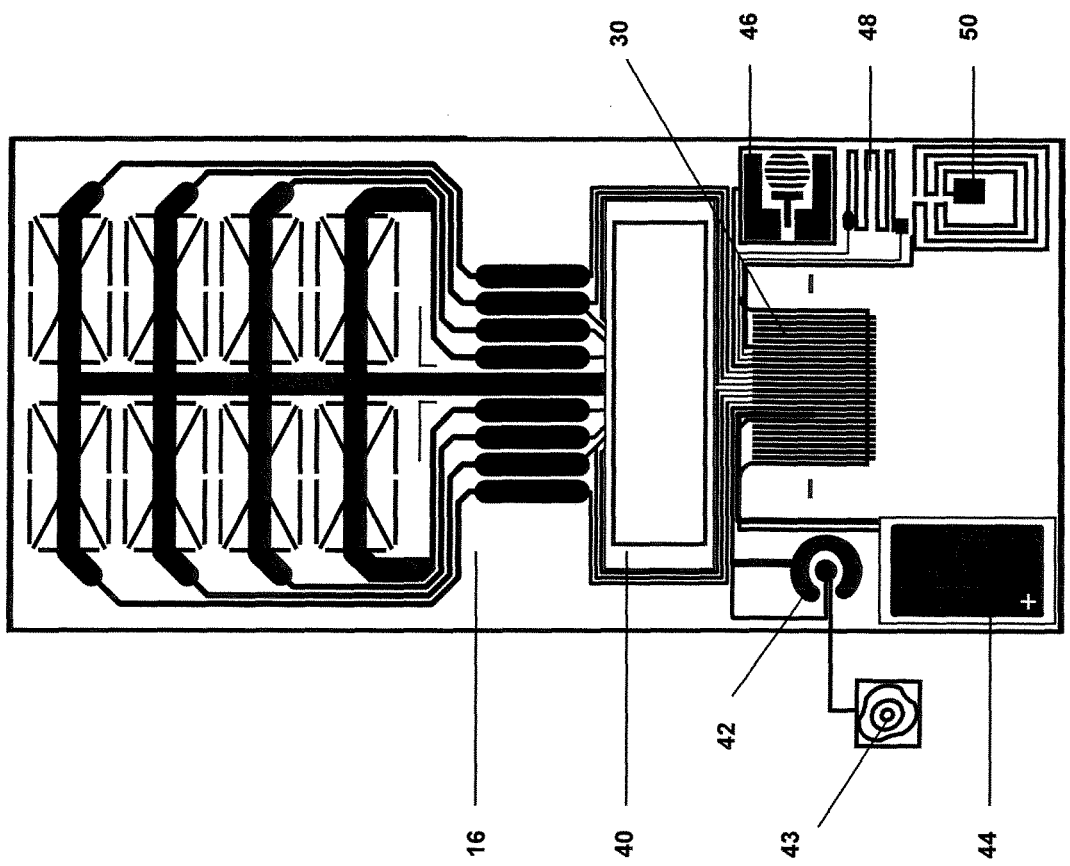
FIG. 4 shows optional printed functions that can be accommodated because of the space savings resulting from the more accurate printing of the conductive grid.

In FIG. 4 a number of optional printed functions are shown that are made possible by the increased empty space on the grid substrate due to the decreased area required for the more accurately printed die-cut conductive traces. For example, areas can be allotted to an organic LED (OLED) display 40, a printed input button 42 for users to input data to the tag (such as a self-adhesive metal dome button 43), a printed battery 44, printed humidity sensors 46, printed or applied temperature sensors 48, and a variety of communication modes 50 including Capacitive Coupled, RFID, HF, UHF, Bluetooth, GSM and NFC. Use of a battery printed on the grid allows for a smaller tag, further contributing to cost savings and ease of inserting the monitoring device into existing assembly processes. Some printed batteries can take on organic shapes, fitting themselves into available open space, rather than requiring a particular geometric area. If an OLED display 40 is provided, the cover 10 will have a window 24 to view the display (FIG. 1).

Figure 5:
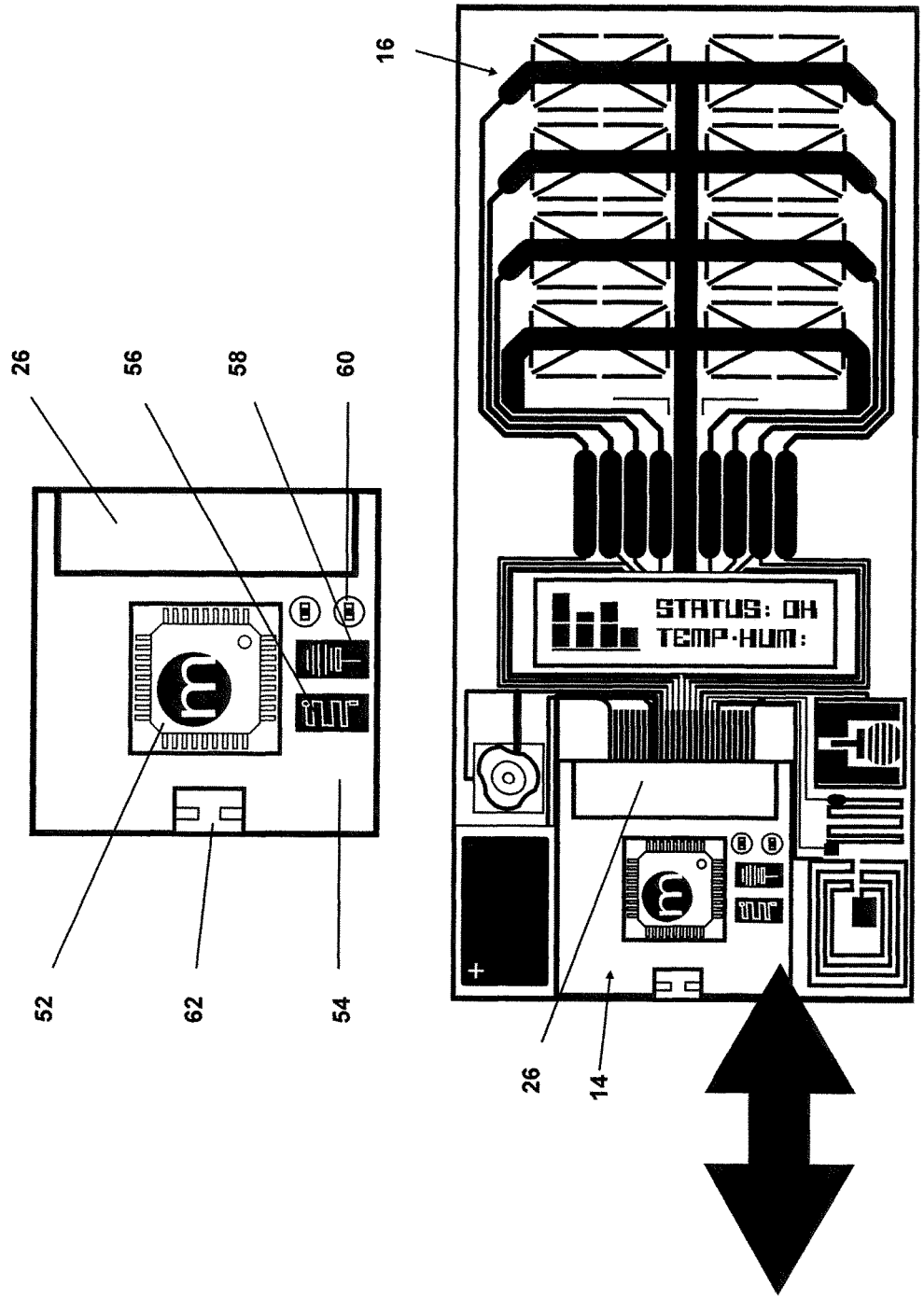
FIG. 5 shows the connection of tag and grid by flat flex connector.

FIG. 5 shows a means of connecting the sensor monitoring tag 14 to the printed grid 16 using a two-part reversible flat flex connector 26. The tag 14 has a microchip 52 and protective foam 54. Other optional components include an on-board temperature sensor 56, on-board humidity sensor 58 or indicator LEDs 60. The tag 14 can also optionally include wired communication 62 such as a micro-B USB plug.

Figure 6A:
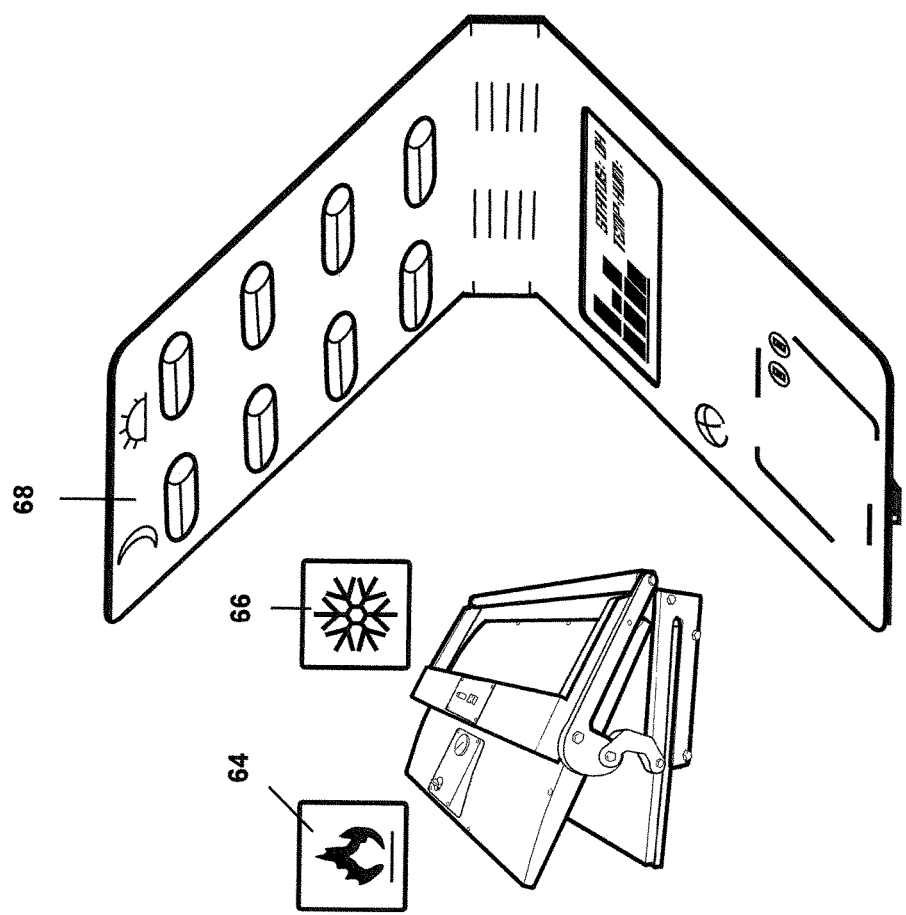
FIG. 6A shows the finished package in an open state after heat or cold sealing.
Figure 6B:
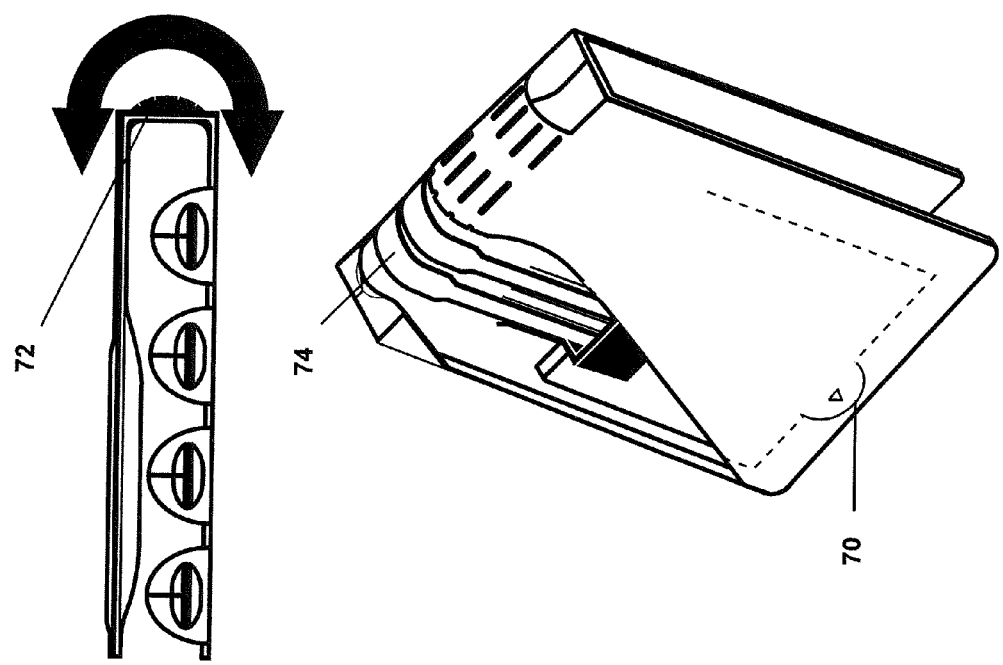
FIG. 6B shows the finished package in a closed state with the unique die-cut spine.

In FIG. 6A a completed medication compliance package 68 is shown in an open state with the monitoring device (tag connected to grid) and the medication blister card hot 64 or cold 66 sealed between two layers of paperboard. FIG. 6B shows two instances of the medication package in a closed state and one location of the pull-out 70 for tag removal. The spine 72 is rounded by die-cutting so the printed conductive traces 74 bend smoothly across the spine 72 and are less likely to be damaged by opening and closing cycles.

Figure 7:
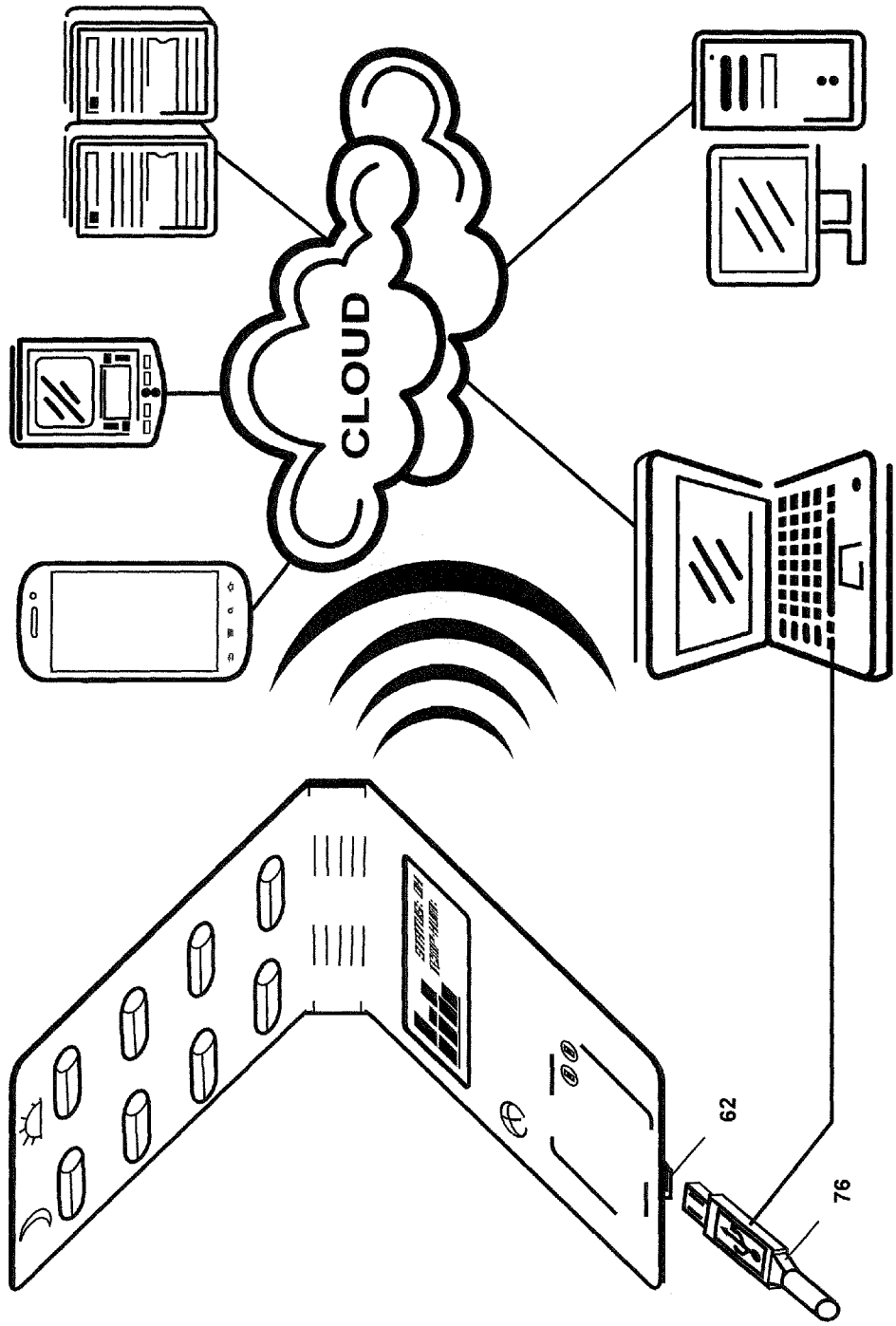
FIG. 7 shows hard wired and wireless communication of data from the package to computers, PDAs and data storage devices.

FIG. 7 shows both hard-wired and wireless means by which the data from the tag can be transmitted to computers, PDAs, data servers or the cloud or other such network conferring great flexibility of use on the device. The wired communication port 62 can be used to connect for example by USB 76 to computer. Wireless communication means include Capacitive Coupled, RFID, HF, UHF, Bluetooth and NFC. Other wired and wireless means are possible.

Figure 8:
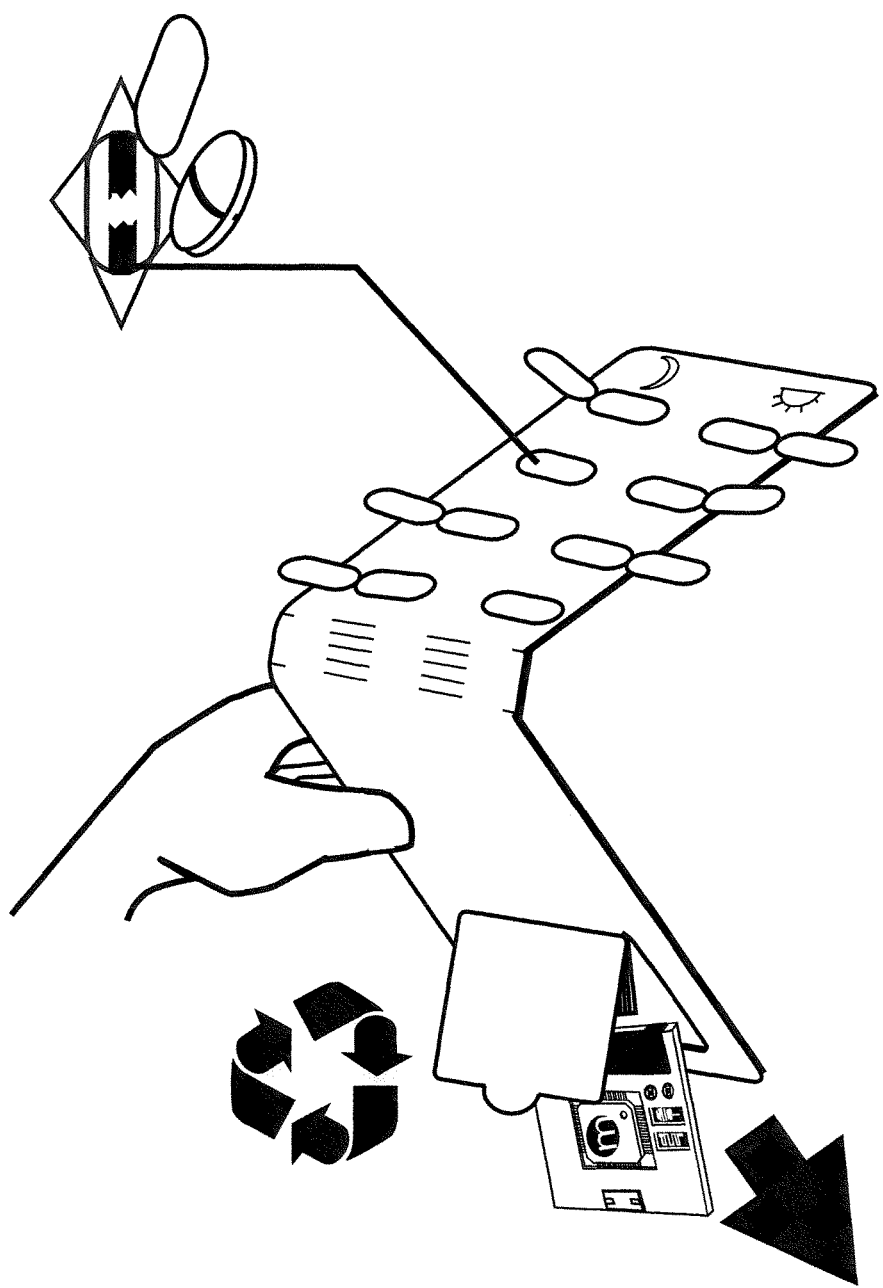
FIG. 8 shows means of recycling the tag after the package has been used.
Figure 18:
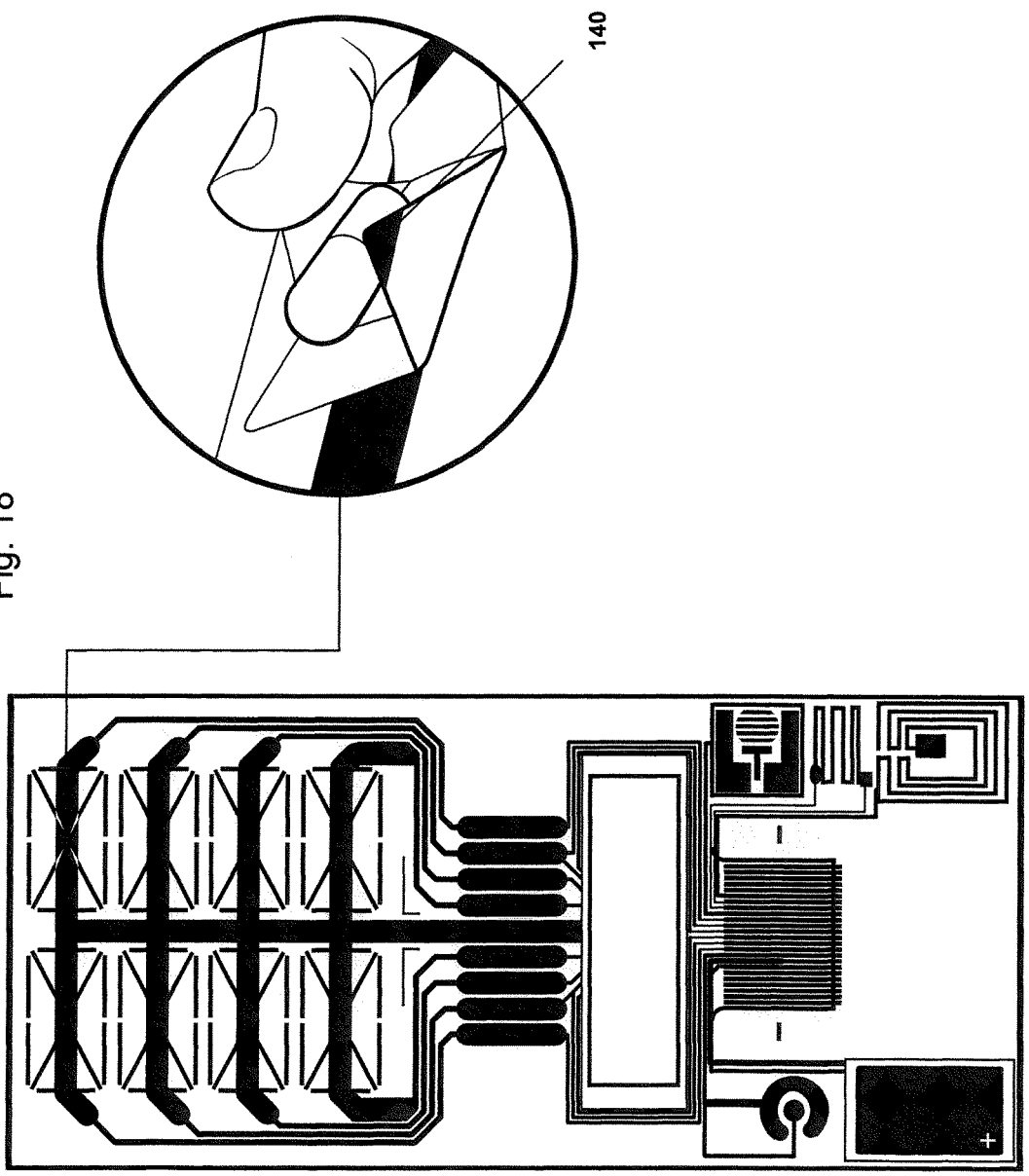
FIG. 18 shows a connective trace being broken.

FIG. 8 shows removal of the tag from the used package by opening the pull-tab and unplugging the flat flex connector. The tag is then recycled, refurbished if required by adding a new power source, reprogrammed if required and attached to a new conductive grid to be inserted in a new package. The grid and paperboard are disposable. FIG. 8 also shows in expanded view how an event is triggered when the conductive trace is broken and the medication is pushed through the blister. See also FIG. 18 for a close-up of the connectivity being broken 140.

Ultra thin (e.g.: Mylar™, food grade plastic, etc.) printed grid substrates can be used to facilitate consumer use by easy and predictable breaking of the substrate and conductive grid by tablet expulsions from the associated blister. Such non paperboard substrates are humidity stable and give more reliable electrical characteristics to the printed grid, minimizing false or missed expulsion events. Thin substrates are easily attached to the blister card (usually by use of self-adhesive backing), and also contribute to easy consumer use by minimizing package thickness.

FIG. 9 shows a content use monitoring package and associated printed circuitry. Again, while the context of the example of FIG. 9 is with respect to a blister card containing medicine, other applications are envisioned for other types of packaging containing other contents.

The standard blister package of FIG. 9 has a little patch of bistatic current-sensitive color-change material beside or around each blister. The color state of such patch shows the dosing status of the associated dose. In the example shown in FIG. 9, the color green 80 indicates a start point that is active at zero hours. The color white 82 indicates inactive. The battery 84 is shown printed in the exposed view of the printed inlay and an exploded view shows a flowchart of the printed inlay. The flowchart shows an optical ink indicator surrounding each blister in conjunction with the printed electronic grid. It will be noted that other colors besides green and white could be used. The electronic module applied to the package can track anticipated expiration of the content by means of time and temperature and/or humidity sensor and thereby also validate the suitability of the contents of the package depending on pre-set thresholds. The thresholds can cause the printed static OLED color patches to turn a specific color so as to indicate that further doses from the package shall not be consumed. Excessive expose to UV radiation can also be monitored and displayed. Furthermore, status could be reflective of the package as a whole and not just for each dose.

Figure 10:
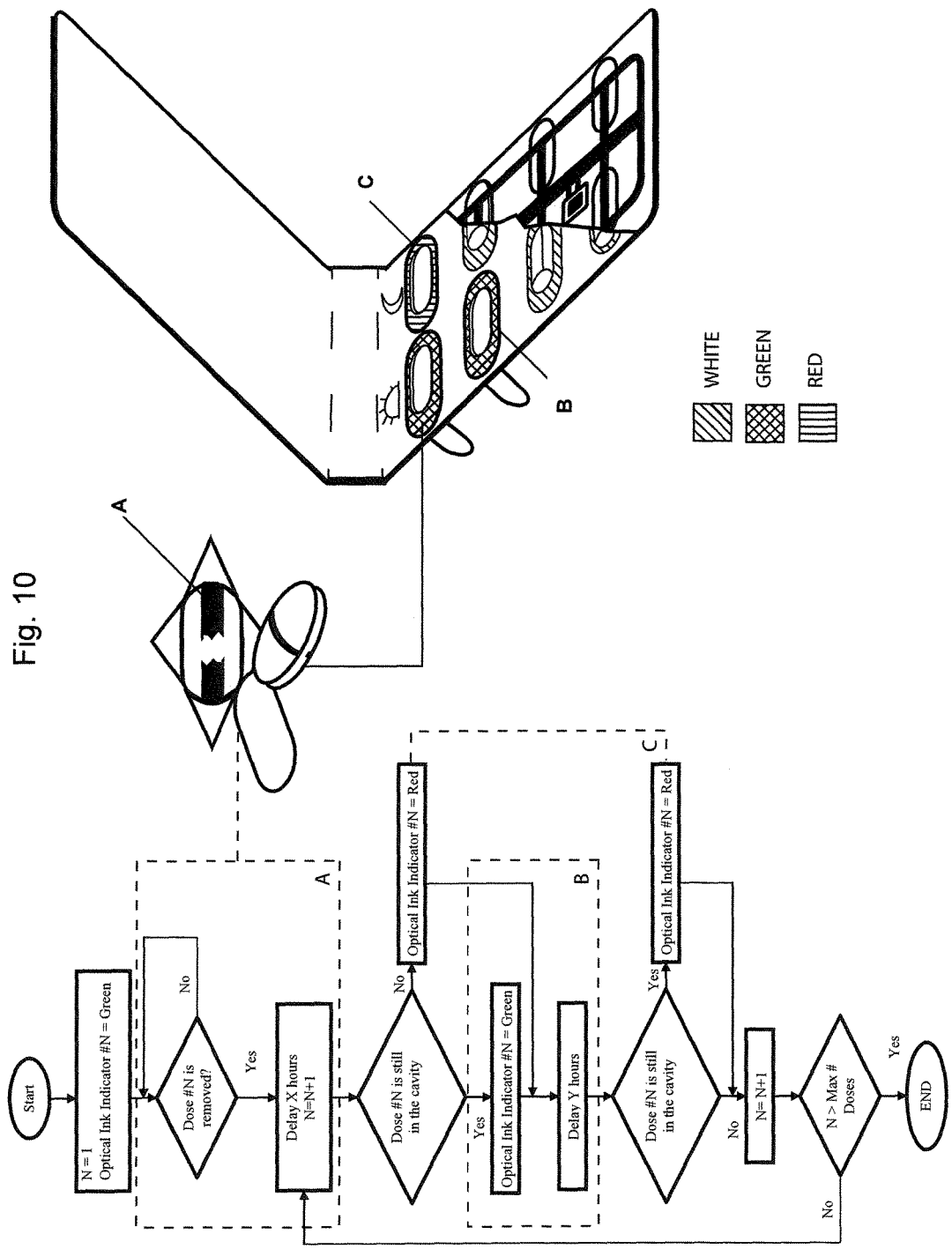
FIG. 10 shows a flow chart of operation for the indicator status.

FIG. 10 shows a flow chart of operation for the indicator status of FIG. 9. In A the initial packet is started when the seal is broken. In B the pill is taken within the appropriate time window and the status indicator is green. In C the pill is taken outside the time window and the status indicator in this example is red. For those pills that have not been opened, the status indicator is white.

Figure 11:
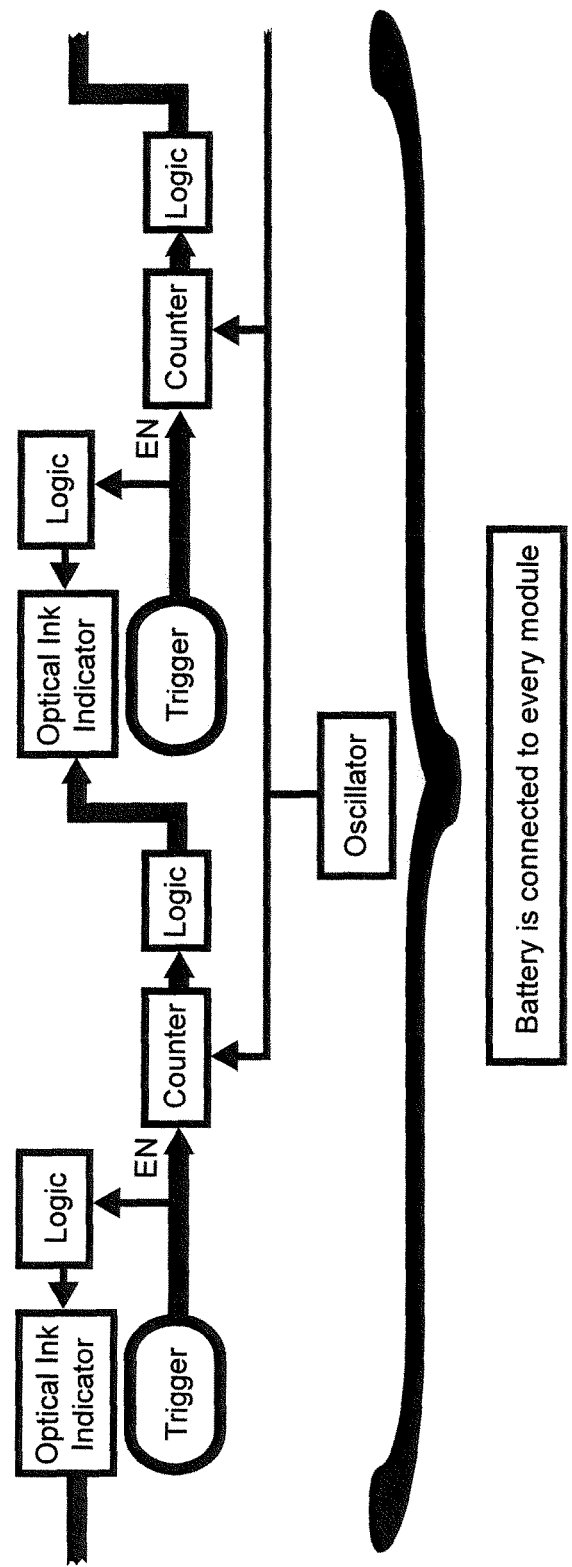
FIG. 11 shows circuitry and how the battery can be connected to every module.

FIG. 11 shows sample circuitry for the system of FIG. 9 and also shows connection of the battery to every module. The battery can be replaced as required, increasing the number of reuses of the tag. The tag's firmware can optionally contain an algorithm to track battery usage and indicate when replacement is required.

Figure 12:
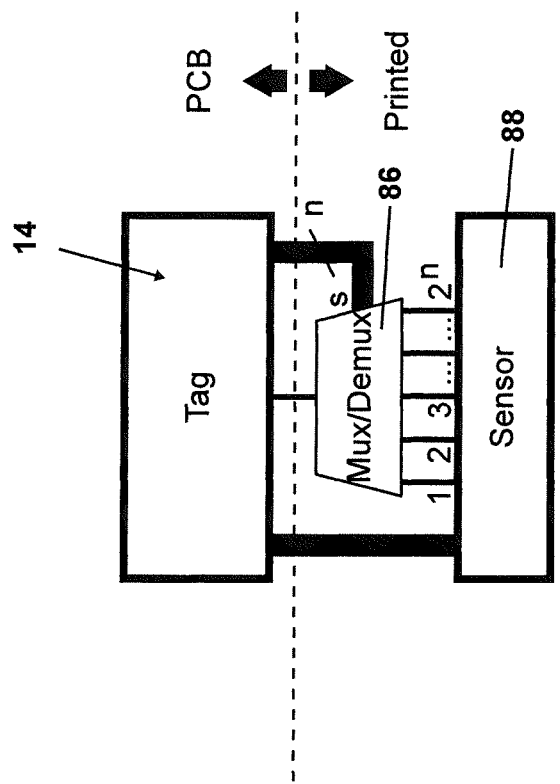
FIG. 12 shows a multiplexer that can be used between the tag and the sensor.

FIG. 12 shows an optional multiplexer 86 that is used between the tag 14 and the grid sensor 88. Printed transistors can be used as multiplexers to reduce the number of traces required to the main chip. The multiplexer allows detection of a large number of doses while keeping the connections between the tag and grid to a minimum. The multiplexer while working with tag logic resides preferably on the grid. This allows for grids with a large content/product count to be monitored by a tag with a much smaller tag to grid connection count. With n tag/grid connections the multiplexer will enable 2n product receptacles on the grid to be monitored. Used in the above example of FIG. 9, n tag/grid connections enables 2n doses on the grid to be monitored.

In place of zero insertion force (ZIF) or low-insertion force connectors, transistors can be printed on the same substrate as the traces which can be arranged to act as a multi-plexing circuit. Such an arrangement only takes a few hundred transistors. The advantage is that it reduces the number of connections. For example, a 100-receptacle package could be arranged in a 10×10 printed grid requiring only 10 connections to the electronic tag. This makes it both less expensive and easier to connect the printed trace circuit to the electronic tag module as well as allowing the monitoring of far more product receptacles on the package than the actual tag integrated circuit has inputs for connection.

FIG. 13 shows a grid cable 90 inserted into the connector, with a small exploded view showing the same.

Figure 14:
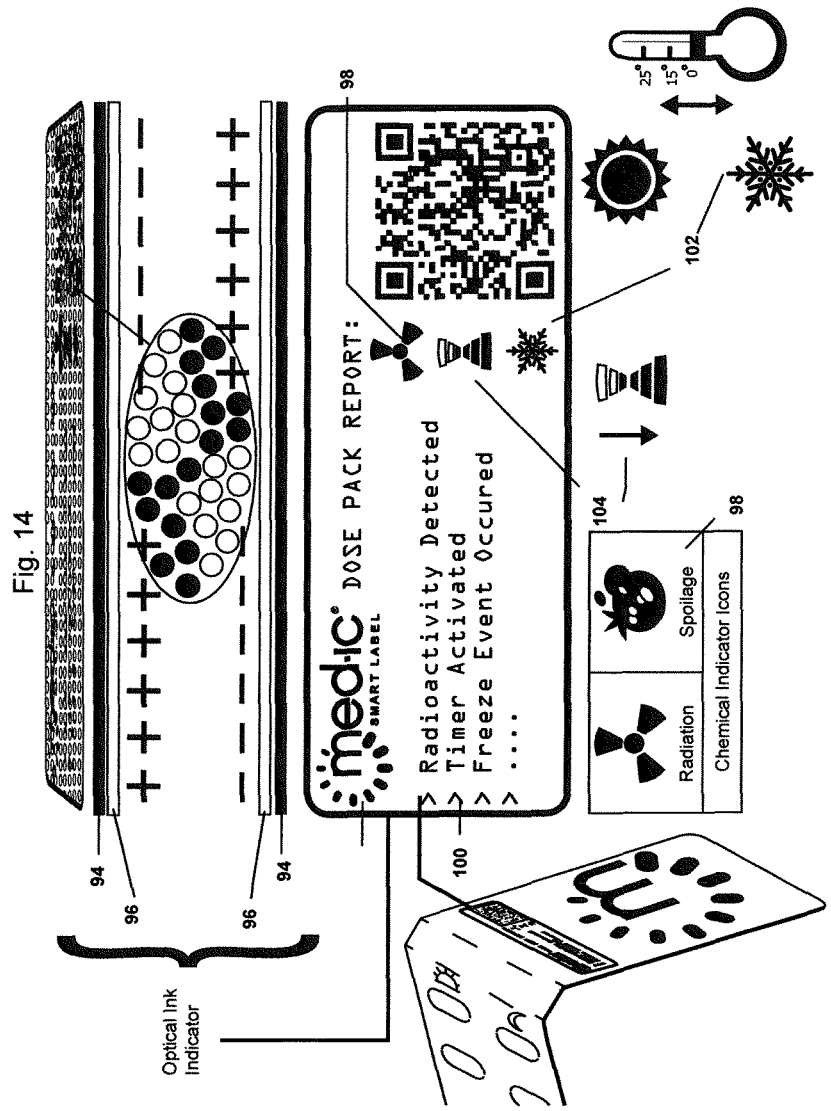
FIG. 14 shows a smart label indicator on the back of the package.

FIG. 14 shows a smart label indicator that can be placed on the package, preferably on the back of the package. The smart label can be used to monitor and report various events, such as the detection of radioactivity, the activation of a timer, spoilage or the occurrence of a freeze event. Various symbols, icon indicators 98 and/or text 100 can be used to describe the events. A timer indicator 104 can be included or a temperature indicator 102. In the sample timer indicator 104 the time progress black bar fades to white. The various layers in the smart label are shown and include an electrode 94 and film 96.

Figure 15:
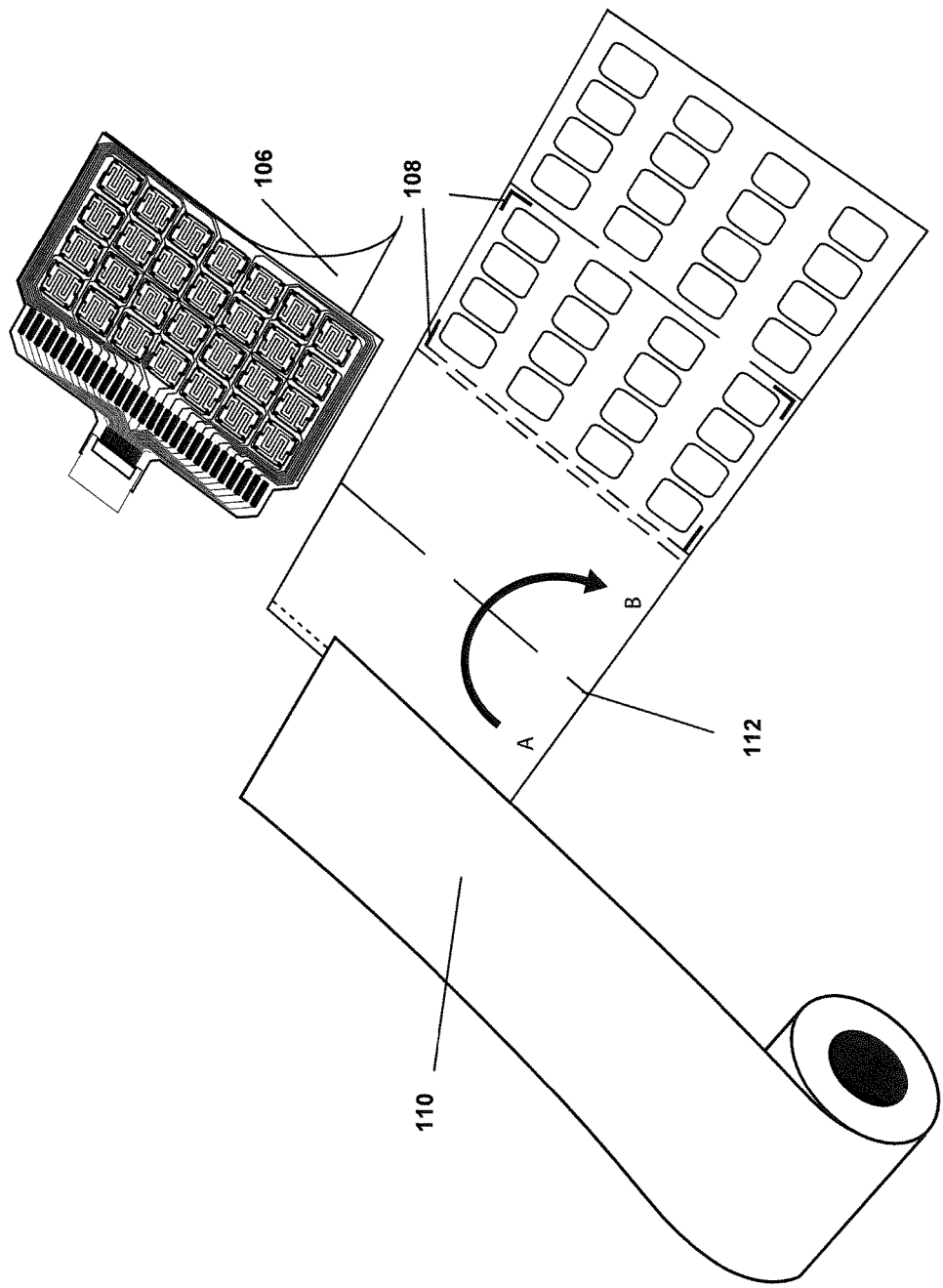
FIG. 15 shows assembly of the package.

FIG. 15 shows one manner of assembling the package. First the liner 106 is peeled away to expose the adhesive backing. Then the inlay 108 is placed face up on the alignment markers. Adhesive foil 110 is placed over the inlay to isolate the contents of the product receptacles. Paperboard flap A is folded over flap B to conceal the tag and traces. The flaps 112 can then be cold sealed or heat sealed together, see for example FIG. 6.

Figure 27:
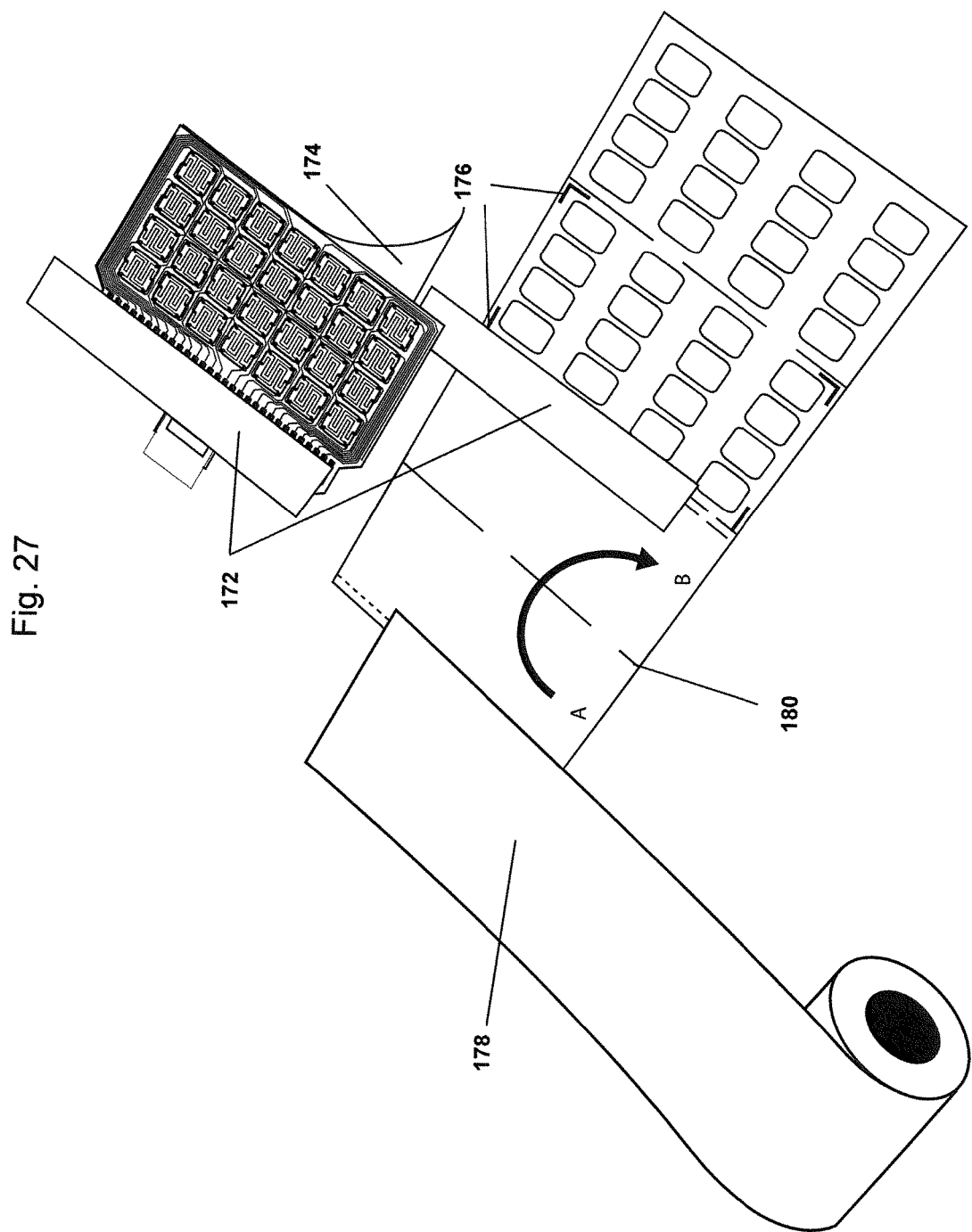
FIG. 27 shows assembly of the package with Mylar; it is a Med-ic insert built as a pharmaceutical/commercial package.

FIG. 27 shows another manner of assembling the package using Mylar. At 172 a first Mylar strip is added over the paperboard spine and a second Mylar strip is added over thick trace of the inlay. At 174 the liner is peeled exposing an adhesive backing. At 176 an inlay is placed face up on alignment markers. At 178 adhesive foil is placed over the inlay to isolate the contents of the product receptacles. At 180 paperboard flap A is folded over paperboard flap B to conceal tag and traces. The flaps can then be cold sealed or heat sealed together.

Figure 16:
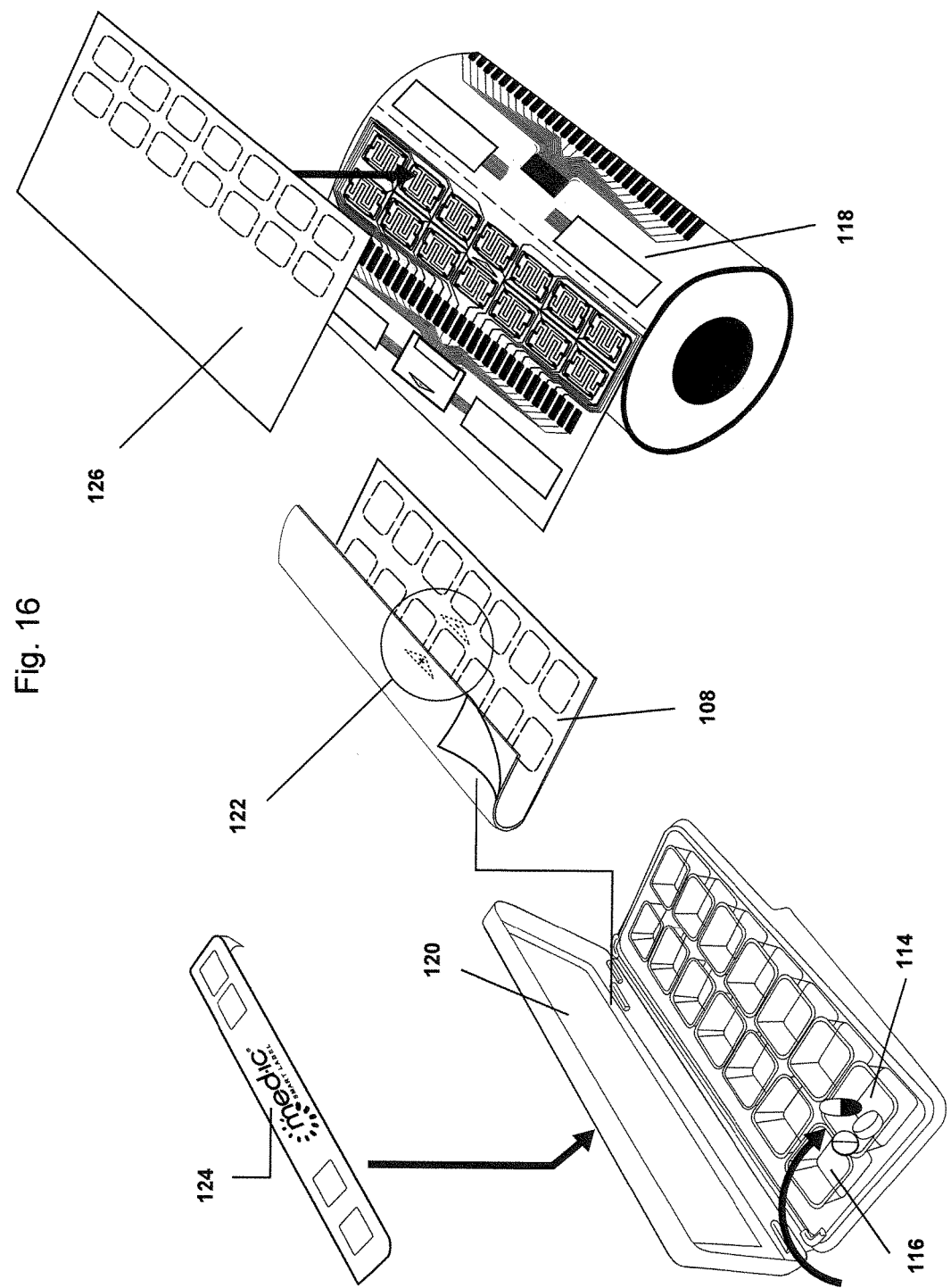
FIG. 16 shows assembly of the finished product.

FIG. 16 shows one manner of assembling the finished product. First the medication or desired contents 114 are placed into the product receptacles, which in this example are polypropylene casing slots 116. The adhesive liner 106 is then removed from the inlay and the inlay 108 is aligned over the slots. There is no adhesive over the slot area. The ECM tag or printed electronics and the optical ink indicators 118 are folded over and attached to the casing cover 120. A copper trace cover label 126 covers the printed electronics and the optical ink indicators 118. Magnetic sensors 122 can be used to detect the opening or closing of the case. A branding label 124 can be applied to the spine.

Various forms of optical ink indicators can be used. For example, bistatic inks can be used, which have advantages over printed OLED and LED modules since bistatic inks do not require power to maintain color.

The substrate can be a full printed Mylar substrate circuit culminating into a printed zero insertion force (ZIF) connection. This circuit can be used in reverse by controlling printed display patches around or beside the individual product receptacle areas.

The conductive traces on Mylar or some other inert substrate with each line leading back to the tag can be used for a second purpose of powering small display patches beside or around each product receptacle or on pre-defined areas of the package. With some printable inks, the state of so-called bi-static display modules can be changed by running a current through the inks. Some e-readers in the market currently achieve that on black and white displays, such as E-ink used on the Kindle readers. These are usually made of a polymer or chemical that changes color when electrically charged.

In one embodiment, a display patch is electrically charged through a corresponding trace and thus the color is changed from clear (none) to black, or into green, orange, or red, for example, indicating, for example in the instance that the product receptacles contain medication, that a particular dose is ready to be taken, is overdue, has been skipped or was taken outside the acceptable dose window. Even once the trace has been broken, the color for that particular area remains stable and unchanged, giving an instant overview of dosing compliance without the need to scan and download the data from the package. Such bi-static patches can be associated with individual doses, or be otherwise arranged so as to provide a simple adherence overview of the package use.

Removing the tag does not change the color. The status indicator complements re-usable electronics as the tag can be used within another package, but the existing package without any electronics still provides a visual overview of the product receptacle statuses, which could include patient dosing history in the instance of medication.

A person of skill in the art will appreciate that this technology can be used to monitor any type of packaging and is not strictly limited to medication monitoring. For example, any package that can be sealed can include the present invention to monitor the opening of the package, along with temperature, time and other similar elements such as shown in FIG. 14. Boxes or cases can be monitored and the results displayed relating to whether the contents therein have spoiled based on elapsed time, exposed temperature, exposed humidity, UV radiation, shock or other elements for which is it desired to monitor.

Now will follow a specific example embodiment of the present invention used to measure and record patient dosing compliance in the particular case that the product receptacles contain blistered medication. This example serves to illustrate various aspects of the invention and methods of manufacturing thereof. It will be appreciated by one skilled in the art that the techniques, elements and methods discussed below can be applied to other forms of packaging with different contents.

In this example, called the Med-ic system, two core components are included, the Med-ic Tag (tag) and Med-ic Grid (grid). The grid is the dose removal sensor while the tag interfaces with the grid sensor detecting the dose events and recording the dose events. The tag and grid are combined to form a Med-ic Inlay (inlay). The inlay is adhered to the foil side of a medication blister. When a dose is removed the dose breaks through a grid circuit which the tag filters, detects and records. The inlay and blistered medication are finally sealed together into a Med-ic Package (package). The package may be heat seal board, pressure seal board or a plastic housing. The package protects the inlay/blaster assembly from the external environment yet still allows for the easy removal of blistered doses.

The inlay interfaces with an external infrastructure to allow the end user to better obtain and view the recorded dose events. The infrastructure can be roughly divided in two types, desktop/PC and mobile.

Desktop/PC infrastructure can include a Med-ic Certiscan Desktop Reader (reader) and the Med-ic Certiscan (software). The reader, which may be a RFID, NFC or Blue tooth device (or all of the above), allows the end users to retrieve the data stored on a tag and allows the end user to view, manipulate and store that data with the software.

The mobile infrastructure includes a smart phone running a Med-ic Certiscan Mobile App (app) and Med-ic Server Backend (backend). The smart phone with the app combines the functionality of the reader and software. The smart phone also communicates with the tag using RFID, NFC and Blue Tooth but can also use WIFI, GSM and dynamic QR codes. Dynamic QR codes allow the smart phone and tag to communicate optically. The smart phone with either WIFI or Cellular Wireless Data (wireless) will act as a two-way communication channel with the backend. The smart phone and backend together enable Med-ic Cloud (cloud) based services for the end user. (At this point it should be noted that a reader may be enabled with wireless communication and can communicate with the backend as well) Cloud services include:

Centralized remote tag data storage and backup
    Real time alerts between the end user and a care giver
    Dosing reminders for end user
    End user account management Med-ic Tag The tag provides an interface to a Med-ic grid, and the processing power to detect, filter and store dose events as well as communicate the presence of dose events to a reader and host device capable of greater functionality that may be needed by the end user. The tag is mostly manufactured with traditional PCB processes but does allow for functionality to be moved off board and implemented with printed electronics. The tag can contain the following modules:

A central processor to provide control over the entire tag system
    A time unit module which provides an absolute timestamp to be assigned to each detected dose
    A power module that will power the tag for up to 5 years in the field
    A communication module that allows the tags to transmit/upload data to a reader and host device
    A sensor connection interface that allows the tag to communicate with the grid to sense dose removal Optionally the grid may contain the following additional modules:

A display module to show status and reminders to the end user making communication with a host device less necessary
    An audio module to indicate both status and reminders to the user
    Additional sensor platforms for detecting and storing temperature, humidity, acceleration, impulse and tactile input
    A multiplexer module as described with reference to FIG. 12.
    Advanced communication modules allowing the tag to communicate via Blue Tooth and NFC which allows the tag to communicate directly with a smart phone

| Module | Description |
| --- | --- |
| Central Processor | This module may be implemented with an ultra-low power, low cost microcontroller or ASIC. The module should have enough functionality to implement a filter algorithm to reject false doses that can be generated on the grid sensor and non-volatile memory to store the dose events. The module may also have additional memory to carry on board end-user data. This module is mostly implemented using traditional semi-conductor processes. For less complex processing it may also be possible to implement the central processing using printable electronics. Similar to identifying the core, basic activities needed then engineering an ASIC the same can be done using printable electronic logic, memory, timing circuitry and sensors. |
| Time Unit | This module interfaces with the central processing to allow for absolute real-time time stamping of doses events. This module can be implemented using traditional timing circuitry (e.g. quartz crystal). |
| Power | This module powers the central processing module, sensors modules, communication modules and other items in the Med-ic package that require power. The tag is an ultra-low power device powered by coin cell batteries or by printed batteries such as Power Paper or other suitable power sources. |
| Communication | The tag should be able to communicate gathered dosing information to a reader and host for the end user to digest. The primary mode of communication is preferably with a passive RFID/NFC communication unit. This allows for ultra-low power, low range two-way communication with a reader and host device. A host device may be a dedicated desktop/mobile/gate RFID/NFC reader or a smart phone. This communication module allows for just a few tags to interface with a host at one time. RFID/NFC requires a loop antenna for communication. This loop antenna is traditionally placed on the tag's PCB but can also be printed on the paper/PET subtracted of the grid using printable electronic processes and interfaced with the tag. More advanced communications may be implemented with Blue Tooth (especially version 4.0 which allows for a low power communication), WIFI and even wireless GSM or other forms of communication. This communication module type is active allowing many tags to communicate with one host and enables much larger communication ranges. |
| Sensor Connection | This module connects the tag with one of the many possible sensor types. Connection with the primary sensor is discussed in detail below. The grid sensor connection types can also be used to connect other sensors which are not onboard the tag PCB. A temperature and humidity sensor for example can be attached traditionally to the PCB or using printed electronics printed off board and connected via a grid connection type. |
| Display | This module may be used by the tag to display status information and reminders to the end user. This module may be onboard the PCB using a traditional TFT LCD display or off board |

| Module | Description |
| --- | --- |
| | implemented with printed electronic technologies such as, E-Ink, OLED and bi-static displays. The display module can be used to generate dynamic QR codes which provide an optical communication path with camera enabled smart phones. |
| Multiplexer | This module allows for grids with a large dose count to be monitored by a tag with a much smaller tag to grid connection count. See FIG. 14 and associated text. |
| Audio | This module can be implemented both on and off the tag's PCB to provide the end user with audio status and reminders. The audio is most commonly generated with an electromechanical or piezoelectric buzzer. |

Med-ic Grid Design

Med-ic grid technology can be divided into two general categories, singular dose (SDD) detection and bus dose detection (BDD). With SDD there is a single sensor circuit/switch for monitoring each dose. With BDD multiple doses can be monitored with one sensor circuit/switch.

Figure 20:
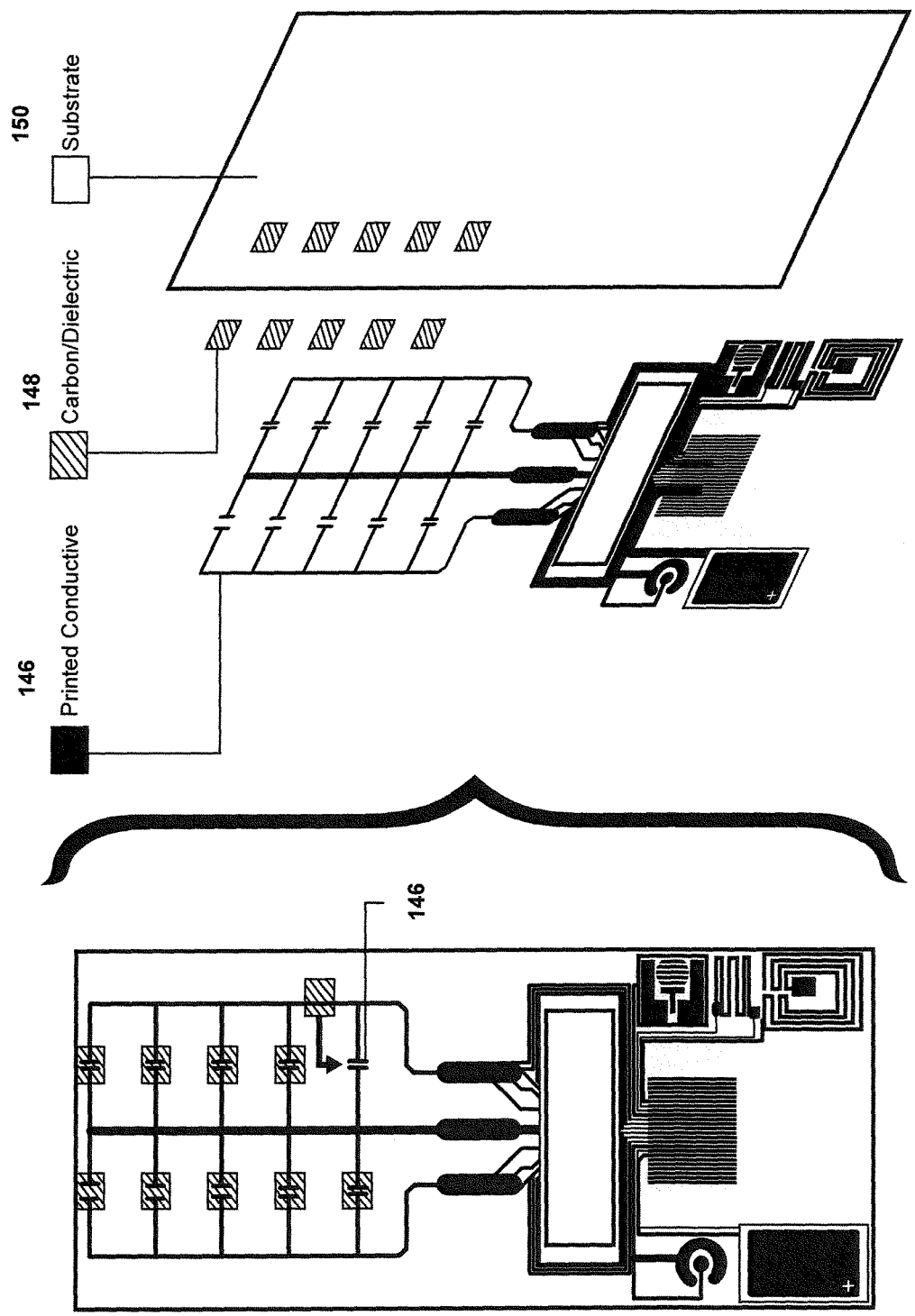
FIG. 20 shows a capacitive singular dose detection, printing both plates.

In SDD's simplest form there is a circuit switch trace covering each dose. When a dose is removed the trace is broken, the switch is opened and this is sensed by the tag. The tag records both the dose removal timestamp and the specific dose that was removed. SDD circuits are mainly constructed with a conductive material forming the individual switch circuits. SDD's main advantage is that each dose can be detected individually. The main disadvantage is that the tag must support a connection for the switch circuit on the grid which can involve as many as 40 individual connections. Having an individual circuit for each dose presents significant challenges for routing the switch circuits and for overall robustness as circuit trace widths and trace separation must be reduced. This is most problematic when the grid is developed with printed electronic technology. FIG. 20 shows a printed capacitive sensor grid formed with printed capacitors 146, carbon/dielectric material 148 and a substrate 150 using SDD.

With BDD multiple doses are monitored by a network of resistances and conductive traces all connected on a bus. In resistive BDD each dose on the bus has both a resistive and conductive element initially electrically shorting the resistive element. When a dose is removed the conductive element is broken forcing the resistance into the bus circuit. The increase in bus resistance is sensed by the tag which records the dose removal time stamp and some typing information about the dose.

With BDD is it not always possible to detect the specific dose that is removed. Finer type granularity can be achieved with BDD as the number of bus elements is increased and the number of doses per bus is reduced. Also the ability to control the accuracy and increase the relative separation of the resistive elements can increase the type detection granularity.

In capacitive BDD each dose on the bus has both a capacitive and conductive element. When a dose is removed the capacitance of the dose is removed from the circuit and the overall capacitance drops by a defined amount. It is this drop in bus capacitance that is sensed by the tag which records the dose removal time stamp and some typing information about the dose. The capacitance for each dose can be either manufactured using a two layer grid (one layer for each capacitor plate) or by using a single layer grid and utilizing the conductive material in the medication blister aluminum backing material as the other capacitor plate. In both cases there are two parallel metal plates (A) separated by a dielectric (er) of a thickness (d) which forms the capacitor.

$$C = \varepsilon_r \frac{A}{4\pi d}$$

Capacitive sensors can be constructed such that one side of the capacitor is applied onto a thin plastic layer and positioned so as to form together with the blister foil of the pharmaceutical blister a capacitive element. Such capacitive elements can be of variable size so as to determine the exact dose position for each tablet to be removed. Capacitive sensor grids can be used alone or in combination with conductive trace grids to provide for flexible construction of the sensor grid and the maximum number of individual doses to be detected.

The main advantage of BDD is the reduced number of connections the tag must support.

Figure 21:
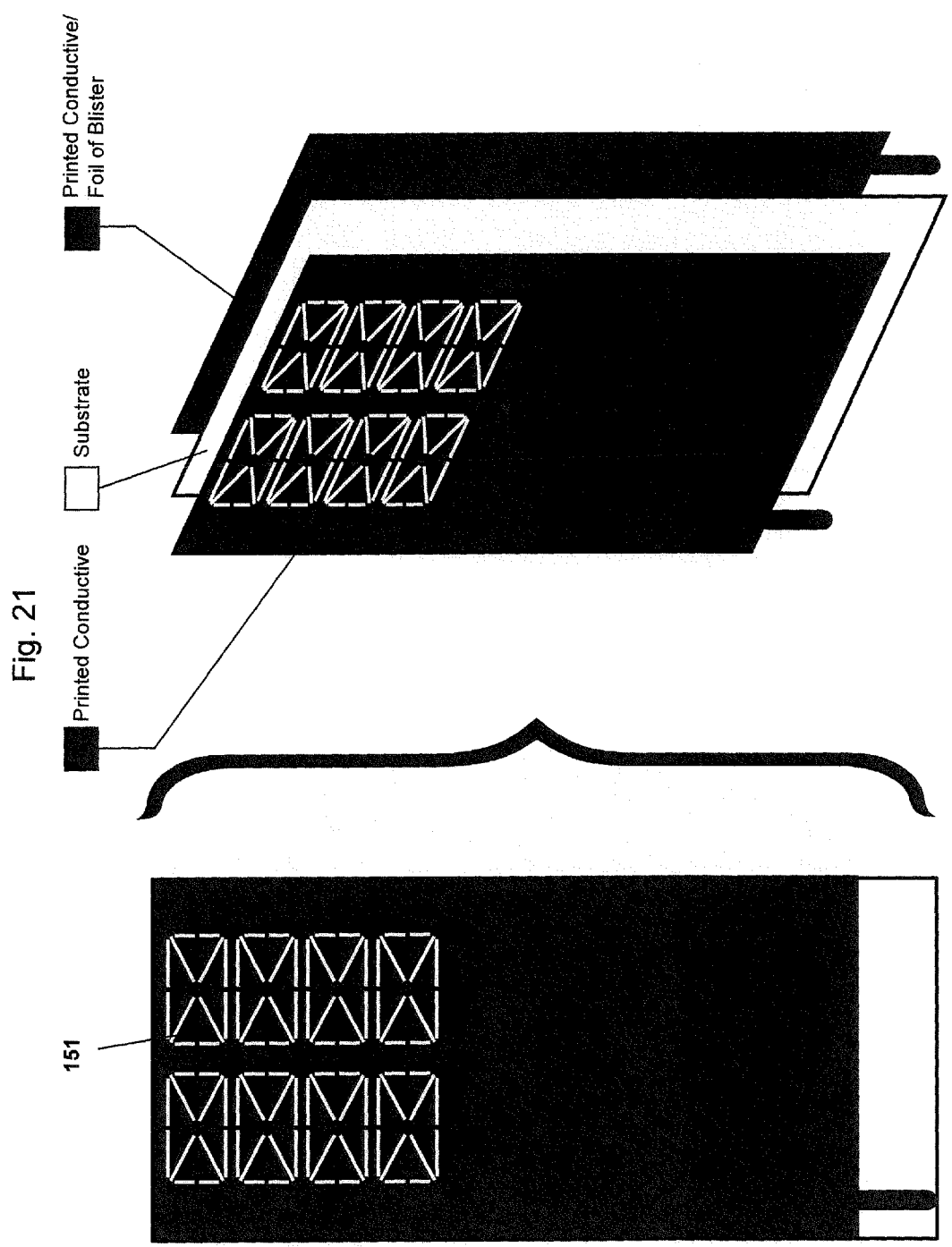
FIG. 21 shows a capacitive grid, printing 1 plate, where the 2nd plate is from the blister foil itself. This is for a generic grid design where each dose is the same. i.e. it cannot differentiate between doses.

FIG. 21 shows a capacitive grid, printing one plate, where the second plate is from the blister foil itself. This is for a generic grid design where each dose is the same. i.e. it cannot differentiate between doses. The die cut for blister opening 151 is shown.

Figure 22:
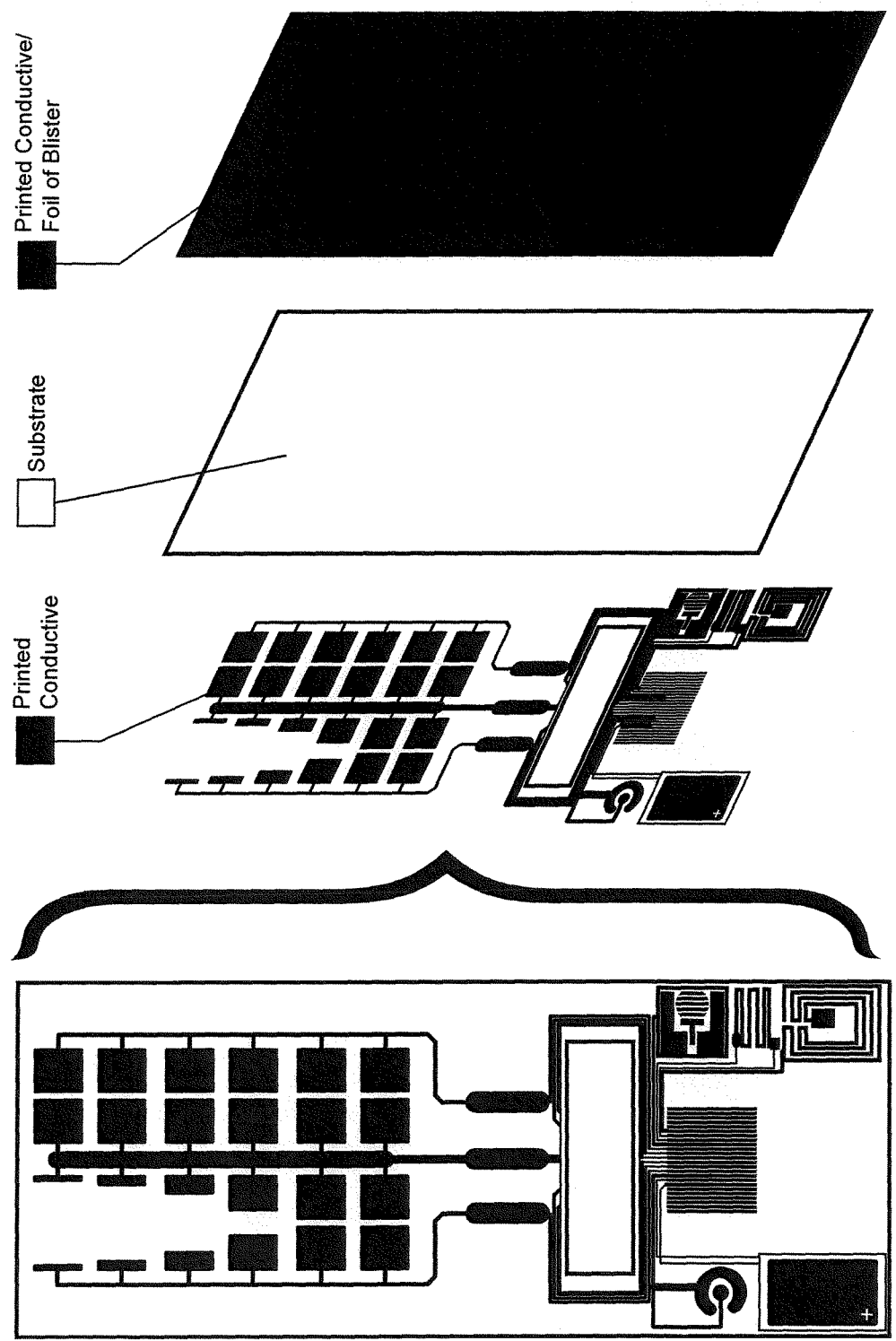
FIG. 22 shows a capacitive grid, printing 1 plate, the 2nd plate is from the blister foil itself. This is for a specific grid design where each dose is NOT the same. i.e. it can differentiate between doses.

FIG. 22 shows a capacitive grid, printing 1 plate, the 2nd plate is from the blister foil itself. This is for a specific grid design where each dose is NOT the same. i.e. it can differentiate between doses.

Figure 23:
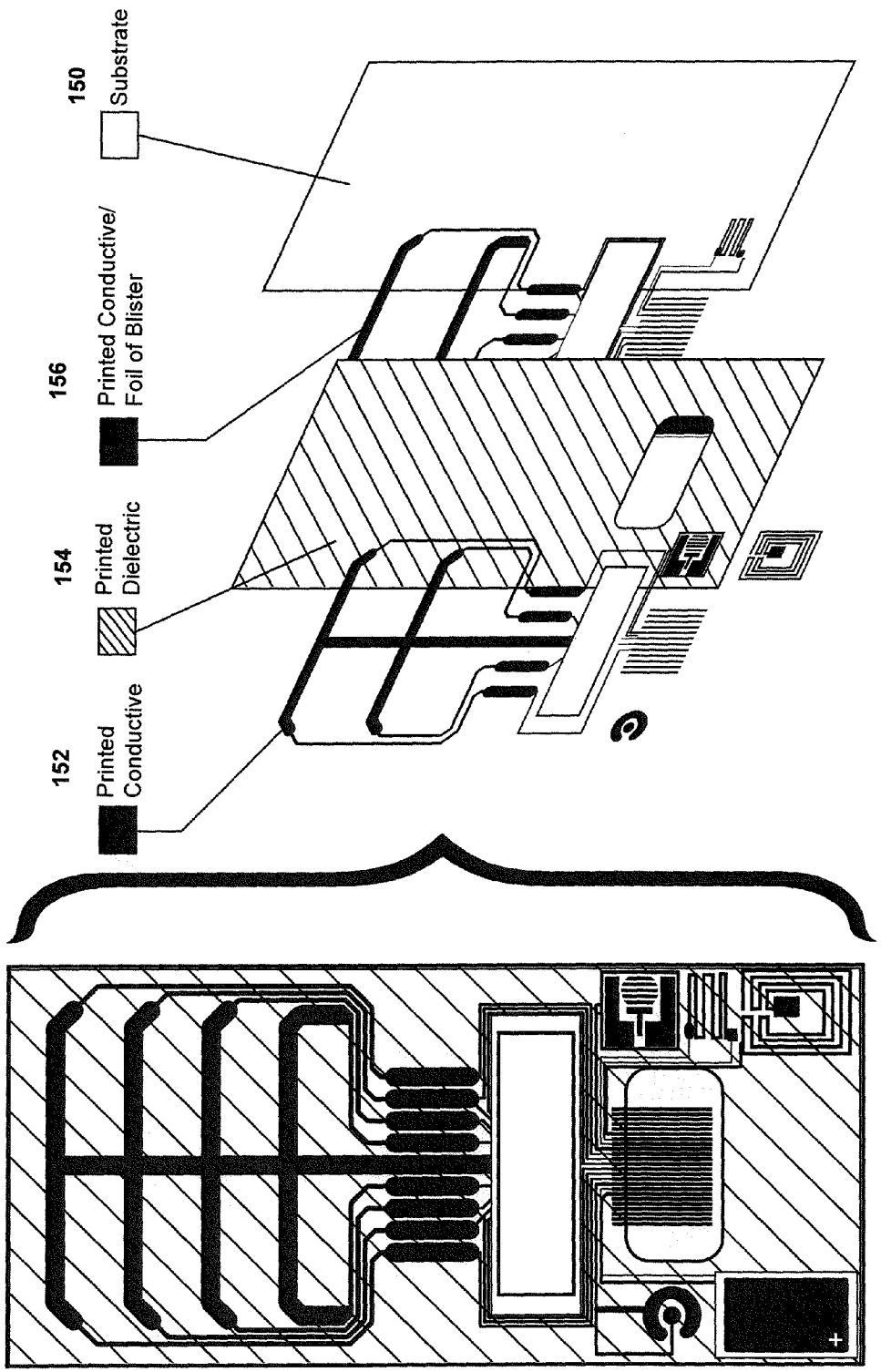
FIG. 23 shows a multilayer circuit.

FIG. 23 shows a multilayer circuit formed with a printed conductive 152, a printed dielectric 154, a printed conductive or foil of a blister pack 156 and a substrate 150. This is useful when the blister doses are very dense so there is not enough room to route all lines in one layer. Lines can be routed in 2 or more layers with lines on top of other lines separated by dielectric to prevent shorting between layers.

Although the above describes SDD and BDD separately it is possible to design a grid that mixes the two techniques, thereby managing the associated advantages and disadvantages.

A second aspect of grid design is related to the die cutting of the grid around the dose cavities of the medication blister and the circuit traces running over the cavities. Die cutting can be used to introduce controlled failure points to assist in pushing the contents of the package through the grid to break a circuit switch to detect the event. Die cutting also provides a means to control the breaking thus protecting sensitive sections of the grid.

Med-ic Grid Material

The grid can be manufactured with both traditional PCB processes and printable electronic technologies or other such technologies. Various methods include: flex PCB, Kapton, flexographic printing on paper/PET/blister barrier foil substrate with conductive, dielectric and resistive inks, digital inkjet print (optional roll-to-roll) on paper/PET/blister barrier foil substrate with conductive, dielectric and resistive inks, screen print (optional roll-to-roll) on paper/PET/blister barrier foil substrate with conductive, dielectric and resistive inks, metal plating with catalyst inks onto a PET substrate, metal foil stamping (hot and cold) onto a PET/blister barrier foil substrate, PET metal foil etching, and metal foil thermal transfer printing on PET/blister barrier foil. A blister barrier foil, usually Aluminum, can allow for the grid sensor to be implemented without the need of extra component material.

Figure 17:
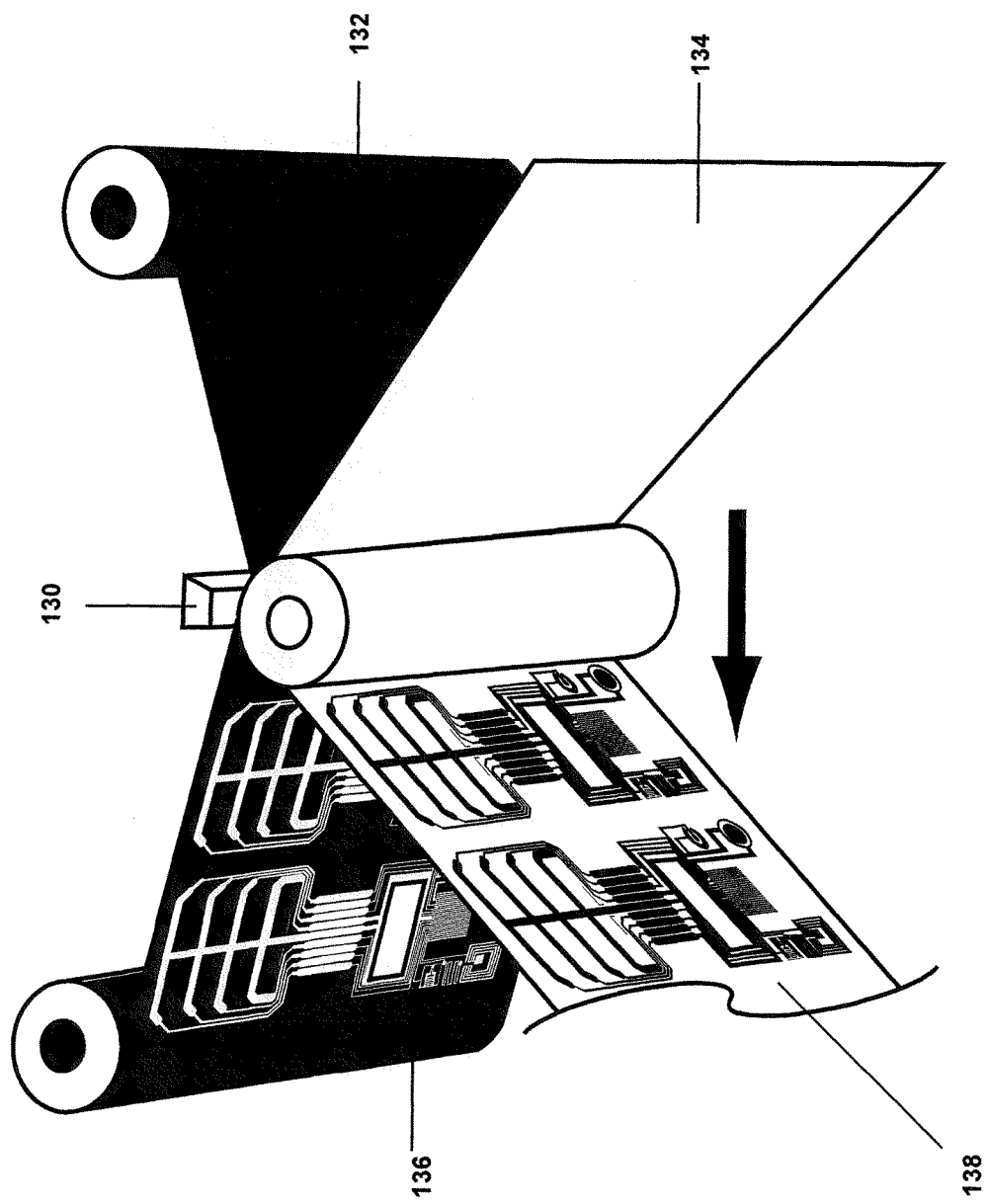
FIG. 17 shows thermal transfer printing.
Figure 19:
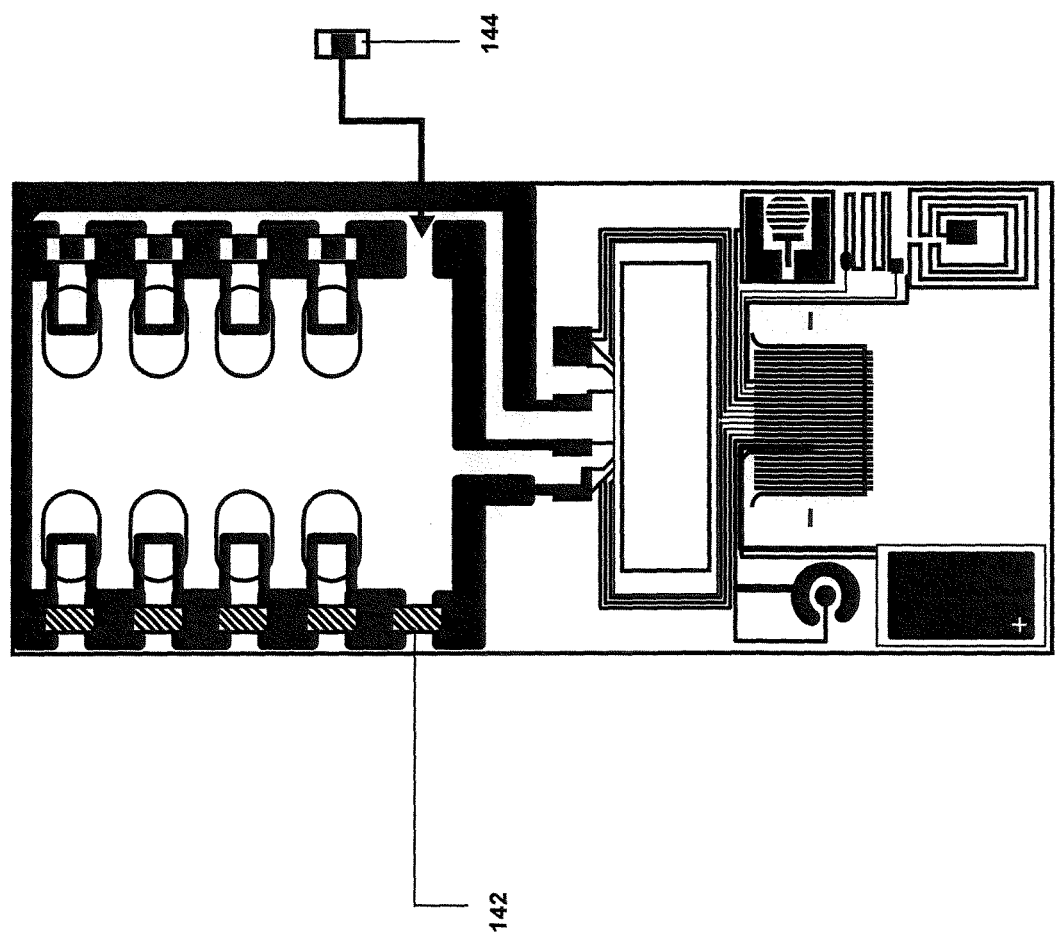
FIG. 19 shows thermal transfer printing on a resistance based grid. A capacitive grid could also be similarly used.

One such manner of production involves metal foil thermal transfer (MFTT) printing on PET. Such a method provides a robust metal layer and is useful for multi-layer designs. MFTT printing has extremely low tooling costs and uses subtractive manufacturing. Thermal transfer ribbon digital printing technology involves releasing conductive material from a continuous roll of conductively coated transfer ribbon onto the surface of the grid substrate, thereby subtractively forming sensor grids and connection patches to be joined with the electronic tag. In addition to conduction materials, resistive and dielectric material can be transferred to form circuit elements. See FIG. 17 which shows ribbon 132, which could be aluminum, dielectric, carbon, copper or other similar substance, along with substrate 134 being fed into the print head 130. On the other side unselected ribbon medium 136 is fed out along with the substrate containing selected ribbon medium 138, i.e. the substrate contains selected aluminum, dielectric, carbon, copper or other similar substance. FIG. 19 shows the result of resistive thermal transfer printing. Printed resistors 142 are shown along with an example SMD resistor 144 which is placed onto the grid.

Figure 30:
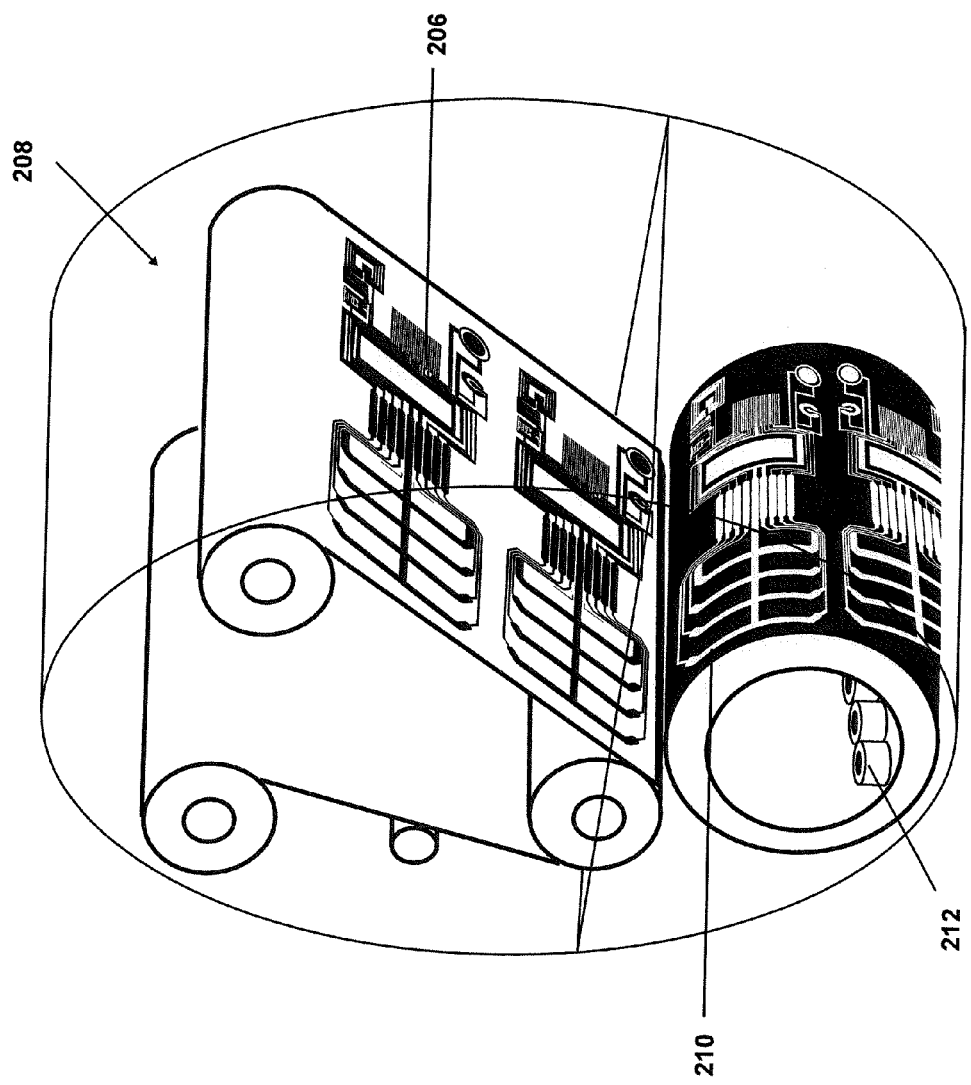
FIG. 30 shows grid manufacturing using vacuum deposition.

Another form of manufacture includes vacuum deposition with various metals onto a PET/blister barrier foil substrate. Such a technique is designed for high volume production allowing relatively fine grid features to be constructed. This is an additive manufacturing method. In vacuum deposition the PET substrate is passed by a metal evaporator within a vacuum chamber which coats the PET with a metalized film. A stencil is inserted between the metal evaporator and the PET substrate to form the circuit design with metalized film. FIG. 30 shows an arrangement of grid manufacturing using vacuum deposition. A substrate 206 having conductive printing is shown in a vacuum deposition chamber. A stencil 210 and metal evaporators 212 are used in the process to form the conductive grid.

Yet another method of manufacture includes metal plating using catalyst inks Such a method can be done with both flexographic and digital Inkjet. This method results in very small tooling costs and allows small volume production. It is relatively inexpensive as copper can be used for the conductive material verses silver based inks A very robust metal layer results when done with a flexographic process. This is an additive manufacturing method.

Med-ic Tag/Grid Connection

Figure 26:
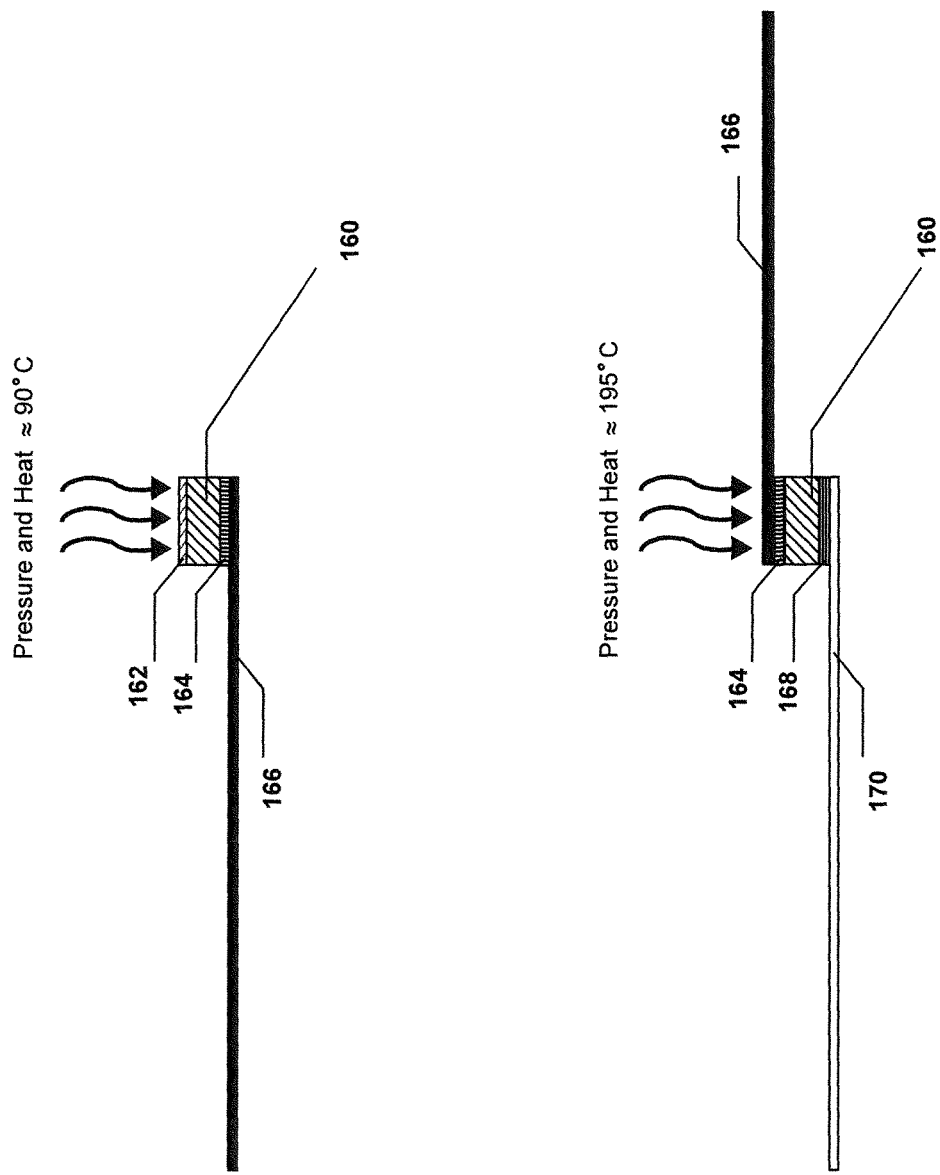
FIG. 26 shows use of anisotropic conductive film for connecting the tag to the grid.

The following connection technologies can be used:

Traditional cable conneceters like zero insertion force (ZIF) connectors or low force insertion connectors. The tag implements the connector and the grid implements the cable portion that is inserted into the connector ACF (Anisotropic conductive film). ACF is a z-axis only conductive material. The ACF is placed between corresponding connection pads between the tag and the grid and then heated using a precise temperature-time-pressure profile. As the ACF cools the conductive partials in the ACF from a robust connection between the tag and grid. This method scales very well. It is easy to add more connections and the grid is easy to manufacture with only low precision die cutting being necessary. FIG. 26 shows use of anisotropic conductive film 160 for connecting the tag to the grid. In one example, the anisotropic conductive film 160 is sandwiched between a liner 162 and an ink pad 164 abutting the inlay 166. Pressure and heat are applied at around 90° C. In another example, the anisotropic conductive film 160 is sandwiched between a PCB pad 168 abutting a PCB 170 and an ink pad 164 abutting the inlay 166. Pressure and heat are applied at around 195° C.

Figure 24:
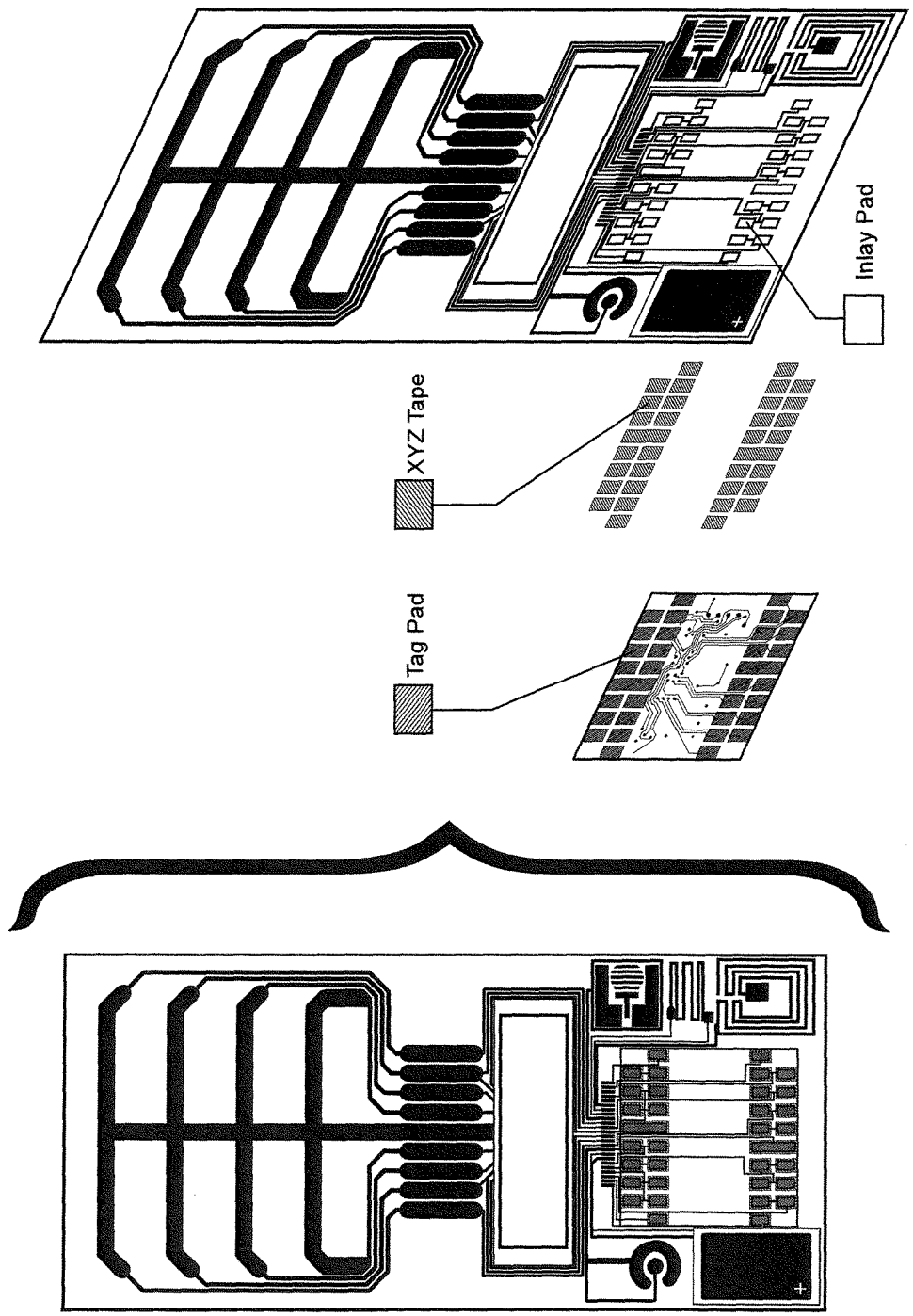
FIG. 24 shows use of XYZ tape for connecting the tag to the grid.
Figure 25:
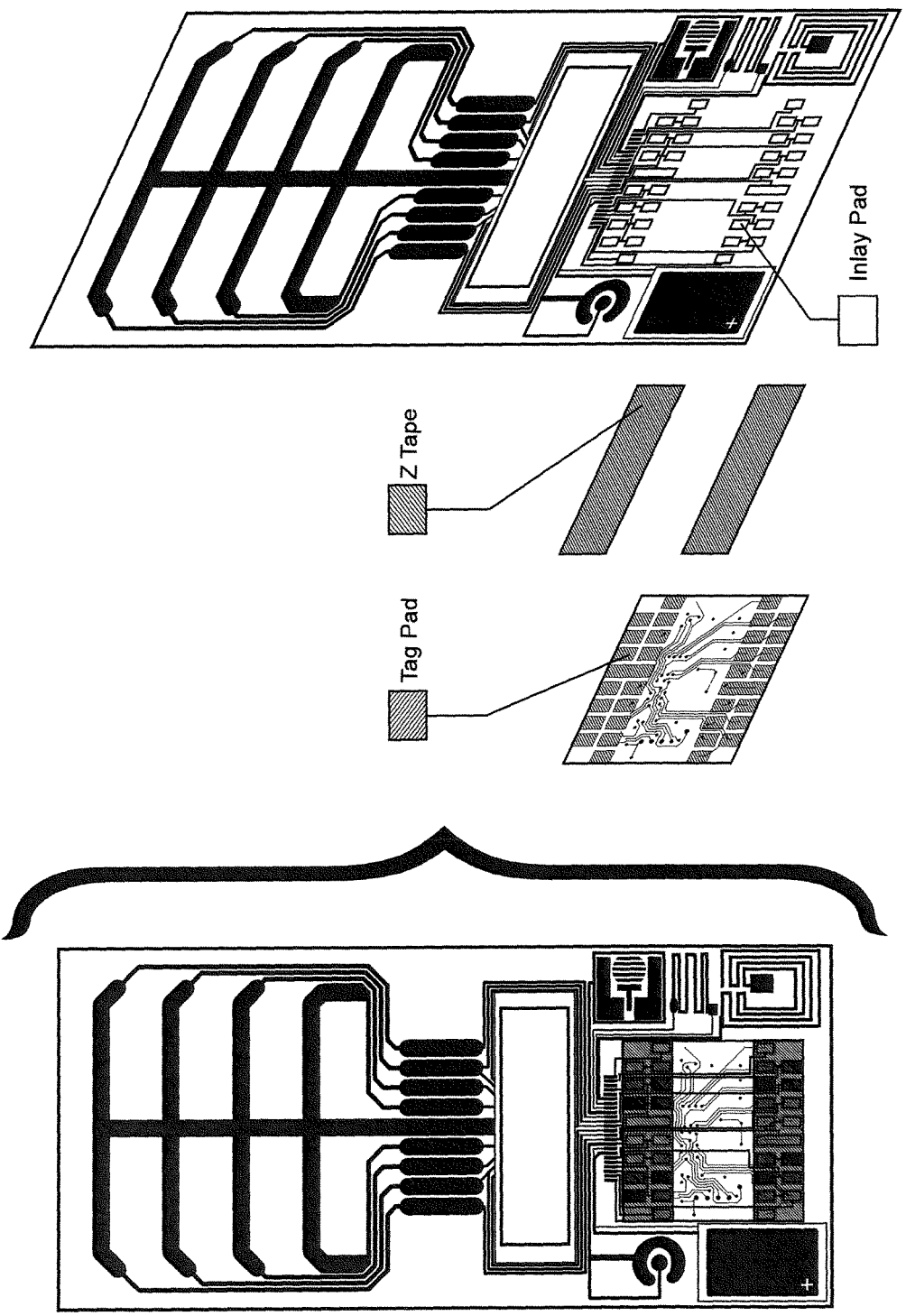
FIG. 25 shows use of Z-tape for connecting the tag to the grid.

Z-Axis tape. The tag implements a grid socket pad with Z-Axis tape. The grid implements the corresponding grid socket. The tag and grid are adhered together to make the electrical connection. Note that Z-Axis tape can also be manufactured from traditional XYZ conduction tape by simply using separate/isolated pieces on each socket pad. Both methods should use a die cut conversion process to assemble the final adhesive conductive matrix that is first applied to the tag and then to the tag with conductive matrix is applied to the grid. See FIG. 24 which shows one example of use of XYZ tape for connecting the tag to the grid. FIG. 25 shows one example of use of Z-tape for connecting the tag to the grid.

Conductive Thread. The tag and grid implement a few connection pads. The conduction pads are connected with conductive thread, the thread applied with an industrial sewing machine.

Conductive Epoxy. The tag and grid implement connection pads. Epoxy is applied either to the tag or grid and the two are adhered together to form the electrical connection.

Heat activate adhesive. Heat activated adhesive works with printed inks to hold the tag pads in position against the conductive grid traces and enable electrical connection between the tag and grid. The conducting particles in the ink migrate through the heat activated adhesive to provide permanent conduction once the adhesive cures. The ink layer can be both printed above or below the heat activated adhesive. The heat activated adhesive can also be anisotropic conductive aiding and providing electrical conduction itself between the tag and the grid. Such a method allows for simple connections printed on the final package. This method is scalable and inexpensive to produce, while being easy to apply using industry standard heat seal plate equipment. FIG. 31A shows tag/grid connection using conductive ink/heat activated adhesive with the ink under the adhesive 214. FIG. 31B shows tag/grid connection using conductive ink/heat activated adhesive with the ink above the adhesive 214. In each instance a PCB 216 is on one side, while the substrate 218 is on the other side. The printed conductive 220 is applied prior to pressure and heat. After applying pressure and heat the heated conductive 222 is sandwiched between the PCB 216 and substrate 218.

Mechanical Crimping/Clamping/Stappling The tag and grid connection pads are held in conductive connection via pressure provided by metal hardware. The connection process is quick.

Med-ic Grid Converting

Grid production is preferably preformed with a roll-to-roll process. This allows for high volume production using commonplace machinery. The following aspects of the grid can use separate production processes:

Tag/Grid Connector—Allows the tag to accurately and quickly connect with the grid. If the tag has a connector this means very accurate die cutting to ensure the tag and grid are properly aligned when connected.

Grid shape and dose die/kiss cutting—Allow the overall grid to be punched out from the roll-to-roll web and to provide the dose die cutting so the dose can be easily pushed through the grid.

Grid "crack n' peel" liner removal—This provides an easy and convenient method of removing the grid liner. The liner is on the opposite side of the printed design covering the blister adhesive which allows the grid to be easily shipped and processed. The "crack n' peel" can be implemented with special die cutting or by selectively voiding the adhesive so the liner easily separates from the grid.

Selective adhesive—Adhesive should not be present around the dose windows to provide a transfer of adhesive on the dose before the patient ingests the medication. Selective adhesion can be implemented by a die cutting process to cut the shape needed then transfer to the grid or by using a flexographic UV cured print on adhesive.

The finished inlay should be designed to fit into a final dosing package. Two factors to consider are the placement of the grid with respect to the blistered medication and the position of the tag in the package.

The grid should be both aligned and laminated to the blistered medication. Grid lamination can be done in two ways:

Pressure sensitive adhesive (PSA)—The grid is manufactured with a PSA and liner. The liner is removed during package assembly to expose the PSA to laminate the grid to the blistered medication. The PSA can be applied using a converted adhesive or by using a "print on" adhesive.

Heat activated adhesive—The grid is manufactured with a "print on" heat activated adhesive which does not need a protective liner and is used in packages that are heat sealed. The final lamination of the grid and medication blister happens during the final dose package heat seal. This process also allows for the printing or applying of selective conductive materials to form the conductive connections between the electronic module and the grid.

Grid alignment to the medication blister can be achieved in two general ways:

Alignment Tool—An external alignment guide tool that aids in laminating the medication blister and grid with the correct registration.

Built-in Package Alignment—The packaging provides a built in medication blister alignment panel that correctly holds the blister onto the grid for lamination. This alignment panel may be part of the final packaging or may be a removable part that is discarded after the grid and blister are laminated.

The position of the tag relative to the grid inside the package can take a few forms:

The tag can be connected adjacent to the grid off the medication blister card.

The tag can be connected onto (centrally) the grid and be central to the medication blister as well.

The medication blister can be formed in such a way that when combined with the grid the tag connects directly to connector ribbon made from the grid and the blister itself.

In all above cases the tag along with the grid are sealed inside the dose packaging. When the tag is connected adjacent to the grid it can support both single and multiple panel packaging. In multiple panel packaging the tag can be on a different panel than the blistered medication locating the connections between the tag and grid across the package spine. Packages of this type should have extra reinforcement where grid sections cross the spine.

In a further scenario the grid itself can be used as the barrier material in the medication blister. This has the advantage of removing one piece from the overall assembly.

Med-ic Package

The finished inlay can be placed within a final drug safe packaging and can be designed to fit into all major clinical trial and pharmaceutical drug packaging formats. The insert provides four attributes:

A fully constructed inlay which requires no production in final drug packaging facilities Fully ESD protected which ensures final production can ignore all ESD safety procedures and equipment A built-in alignment apparatus/method that will register the inlay with the blistered medication Printed graphics and instruction which help the patient use the medication as prescribed.

For clinical trial packaging the inlay is formed into an insert which is used by the end drug packager to construct the final child resistant (CR) drug packaging. The final drug packager can insert and seal (heat seal, cold seal or other) the medication blister into the insert. The insert then becomes part of the final package. The insert works with major CR clinical packaging such as Keystone's Eco-slide and Keypak, MWV's Dosepack and Stora Enso's SHR.

The insert when used in pharmaceutical drug packaging provides the full packaging solution. The pharmacist, for example, can place and seal (heat seal, cold or other) the medication into the insert to produce the final drug package for the customer.

Figure 28:
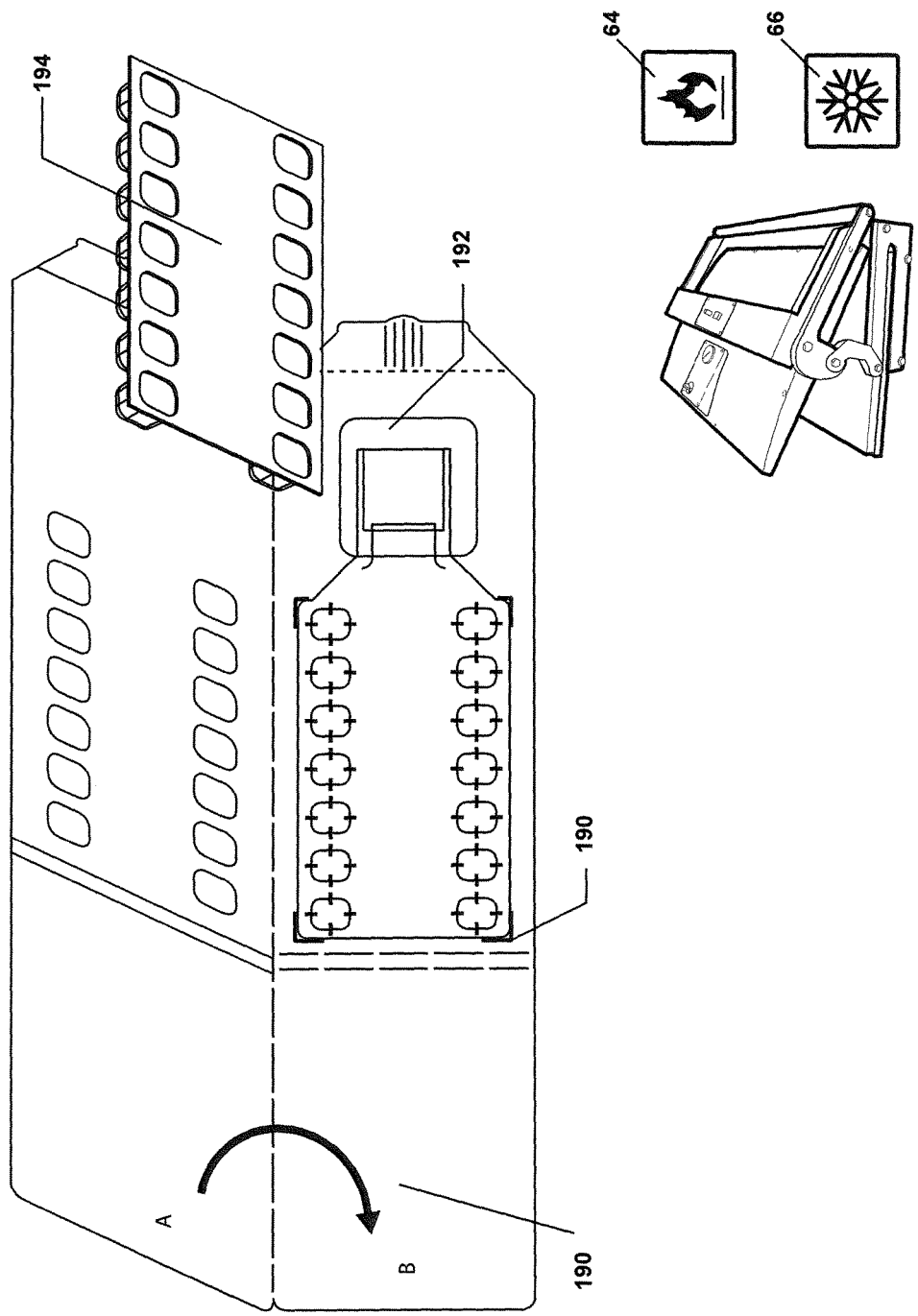
FIG. 28 shows a Med-ic insert Clinical Trial (Child resistant (CR) ready).

FIG. 28 shows a Med-ic insert Clinical Trial (Child resistant (CR) ready). In step 190 the inlay is aligned with printed marking lines. In step an ESD label foil is added, while the blister added in step 194. Step 196 involves folding the paperboard flap A over flap B. The flaps may be cold or heat sealed together.

Figure 29:
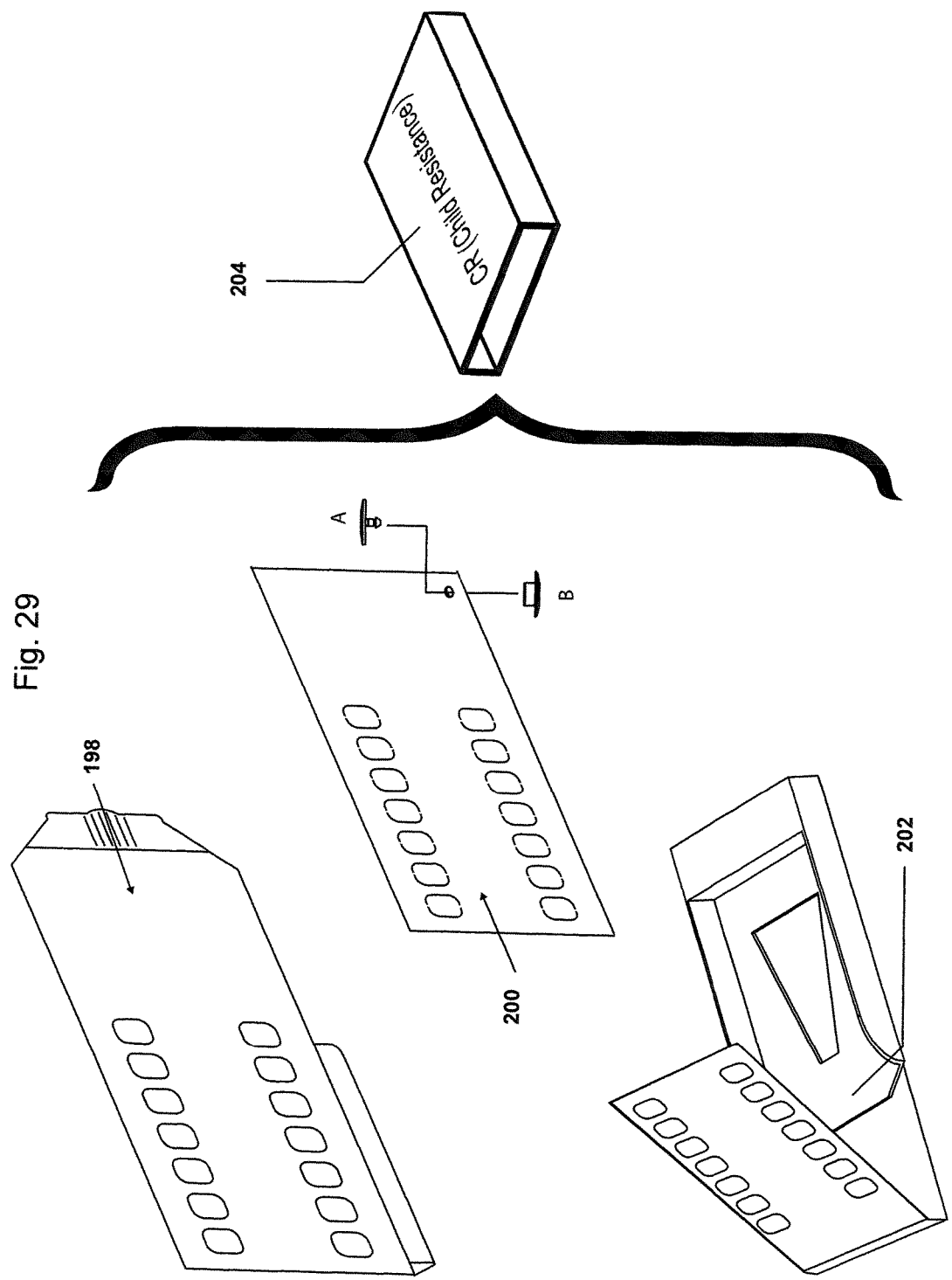
FIG. 29 shows a Med-ic Insert in actual Clinical Trial CR packaging.

FIG. 29 shows a Med-ic Insert in actual Clinical Trial CR packaging. In step 198 a DosePak, Inlay is sealed within an inner sleeve. In step 200, ecoslide-RX and inlay are sealed within the inner sleeve and rivits A and B added. Step 202 shows a Stora Enso and Inlay paperboard attached to the end panel of the inner box. Step 204 shows insertion into a child resistant box.

Quality Assurance (QA) can be used to verify the grids are of high quality and the tag functionality is fully operational.

The tag at all times can be programmed to know what QA steps it has passed and what steps remain to be completed. Thus if a tag is not ready for a certain step, the software will alert the QA personnel that the step is not possible.

The tag transmits data that can be applied to measure the outcome as time-dependent covariates or by similar means to reduce error variance and increase the statistical power of the trial design. The data can be used to establish patient compliance profiles or in clinical drug trials. Patient compliance profiles can incorporate a time dimension using multivariate regression techniques to create dynamic compliance profiles for individual patients or groups of patients. Patient compliance with medication can be monitored in general pharmacy settings. Similarly, the compliance data can be used by the prescribing physician or pharmacist to improve the patient's compliance using motivational counseling, positive reinforcement, limit setting and/or other behavior modifying techniques. The data obtained in multiple diverse settings can be pooled to form a common resource for further data mining. Any such pooled data can be stored remotely on a cloud server. Diverse persons of interest can be allowed application-specific access to the pooled remote data base.

The device described can be incorporated into a secure compliance monitoring blister package for the dispensing of medications for which compliance with dosing is considered critical. Medications with high dependence liability such as opiate and similar analgesics can be blister packaged and combined with a dispensing strategy comprising behavioural contracting, motivational counseling, and targeted education between the patient and clinician to minimize the possibility of inadvertent physical dependence through non compliance with dosing schedules. The device can also form part of a home care system to monitor and improve patient compliance with prescribed medication. The device can also form part of an integrated health management system to improve clinical care and provide logistics track and trace for medications. Similarly, the device can form part of a proprietary medication compliance monitoring/track and trace/and behaviour modification system for medications that are critically sensitive to non-compliance.

The device can also form part of a proprietary system to increase medication persistence or brand persistence.

The blister package can optionally incorporate a unique ID number to facilitate tracking and tracing of the medication. The ID number can be used to authenticate the content and detect tampering with the medication package.

The package can be equipped with reminder devices for the user. Such reminders can be auditory, visual or tactile using sounds, LEDs, LCDs, OLEDs, or vibration.

It will be appreciated by one skilled in the art that variants can exist in the above-described material, package layout, application and method of manufacturing. The specific examples provided herein relate to a medication monitoring system and method; however the materials, methods of application and arrangements of the invention can be applied to other types of packaging and contents.

The scope of the claims should not be limited by the preferred embodiments set forth in the examples given above, but should be given the broadest interpretation consistent with the description as a whole.

What is claimed is:

1. A smart package comprising:
a card having one or more product receptacles;
a tag having re-usable electronic circuitry and power source, the tag being an electronic sensor monitoring tag;
a conductive grid printed on a thin flexible substrate and connected to the tag so the tag and grid are in electrical continuity to form a monitoring device, the conductive grid being aligned with the one or more product receptacles in the card; and
an optical ink indicator that is electrically connected with the conductive grid and surrounds the one or more product receptacles;
wherein the optical ink indicator is configured to display a status of the one or more product receptacles by changing color;
the one or more product receptacles are configured so that opening one of the product receptacles breaks the conductive grid, and wherein the optical ink indicator is configured to automatically change the status in response to breaking the conductive grid.

2. The smart package of claim 1 wherein the status indicates one of the product receptacles being unopened, being opened within an appropriate time window, being opened within an inappropriate time window, and/or expiration of content by time, temperature, humidity sensor, exposure to UV radiation, or non-compliancy.

3. The smart package of claim 1 wherein the grid is connected using conductive patches applied or printed onto heat sealable cardboard.

4. The smart package of claim 1 wherein the grid is connected using conductive stitching.

5. The smart package of claim 1 wherein the grid is connected using a continuous surface of Z-directional conductive adhesive tape.

6. The smart package of claim 1 wherein the grid is connected using selectively applied XYZ-directional conductive adhesive tape.

7. The smart package of claim 1 wherein the grid is connected using a continuous surface of anisotropic conductive film.

8. The smart package of claim 1 wherein the grid is formed with thermal transfer ribbon digital printing technology.

9. The smart package of claim 1 wherein the grid is formed with vacuum deposition.

10. The smart package of claim 1 wherein the product receptacles are blisters.

11. The smart package of claim 1 further comprising connection patches on the grid for connecting to the tag wherein the grid and connection patches are subtractively formed by transfer ribbon.

12. The smart package of claim 11 further comprising a heat activated adhesive on one side of the grid.

13. The smart package of claim 1 for use in monitoring patient compliance during clinical drug trials.

14. The smart package of claim 13 wherein the tag has data communication means for transmitting data.

15. The smart package of claim 14 wherein the data is used for measuring non-time-dependent and/or time-dependent covariates to reduce error variance and increase statistical power of the drug trial.

16. The smart package of claim 14 wherein the data establishes patient compliance profiles.

17. The smart package of claim 16 wherein the patient compliance profiles incorporate a time dimension using multivariate regression techniques to create dynamic compliance profiles for individual patients or groups of patients.

18. The smart package of claim 14 wherein the data is from various sources and is pooled to form a common resource for further data mining.

19. The smart package of claim 18 wherein the pooled data are stored remotely on a cloud server.

20. The smart package of claim 1 as a secure compliance monitoring blister package for the dispensing of medication.

21. The smart package of claim 1 wherein the package incorporates a unique ID number to facilitate tracking.

22. The smart package of claim 21 wherein the ID number is used to one or both of authenticate content and detect tampering with the package.

23. The smart package of claim 1 wherein the package is equipped with reminder devices for the user.

24. The smart package of claim 23 wherein the reminders are auditory, visual or tactile using sounds, LEDs, LCDs, OLEDs or vibration.

25. The smart package of claim 2 wherein the tag validates suitability of the content based on pre-set thresholds.

26. The smart package of claim 25 wherein the optical ink indicator changes color to indicate that the content shall not be consumed when the tag determines the content is unsuitable based on the pre-set thresholds.

* * * * *